US006987307B2

(12) United States Patent
White et al.

(10) Patent No.: US 6,987,307 B2
(45) Date of Patent: Jan. 17, 2006

(54) STAND-ALONE ORGANIC-BASED PASSIVE DEVICES

(75) Inventors: George E. White, Marietta, GA (US); Madhavan Swaminathan, Marietta, GA (US); Venkatesh Sundaram, Norcross, GA (US); Sidharth Dalmia, Alpharetta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 10/405,024

(22) Filed: Mar. 28, 2003

(65) Prior Publication Data

US 2004/0000701 A1    Jan. 1, 2004

(51) Int. Cl.
*H01L 23/12* (2006.01)
*H01L 23/053* (2006.01)
*H01L 23/552* (2006.01)
*H01L 29/00* (2006.01)

(52) U.S. Cl. .................. 257/508; 257/528; 257/531; 257/660; 257/759; 257/700

(58) Field of Classification Search ............... 257/664, 257/508, 516, 528, 531, 660, 700, 759
See application file for complete search history.

(56) References Cited

U.S. PATENT DOCUMENTS

| 5,106,461 A | 4/1992 | Volfson et al. |
|---|---|---|
| 5,162,257 A | 11/1992 | Yung |
| 5,247,377 A | 9/1993 | Omeis et al. |
| 5,270,493 A | 12/1993 | Inoue et al. |
| 5,323,128 A | 6/1994 | Ishizaki et al. |
| 5,349,314 A | 9/1994 | Shimizu et al. |
| 5,373,271 A | 12/1994 | Hirai et al. |
| 5,384,434 A | 1/1995 | Mandai et al. |
| 5,396,201 A | 3/1995 | Ishizaki et al. |
| 5,416,454 A | 5/1995 | McVeety |
| 5,497,337 A | 3/1996 | Ponnapalli et al. |
| 5,517,751 A | 5/1996 | Bross et al. |
| 5,521,564 A | 5/1996 | Kaneko et al. |
| 5,532,667 A * | 7/1996 | Haertling et al. ........... 336/177 |

(Continued)

FOREIGN PATENT DOCUMENTS

EP    0 645 952 A1    3/1995

(Continued)

OTHER PUBLICATIONS www.stneasy.org.tmp; Display from INSPEC; Taoka, M., Kanetaka, T., Dec. 4, 2002.

(Continued)

*Primary Examiner*—Nathan J. Flynn
*Assistant Examiner*—Victor A. Mandala, Jr.
(74) *Attorney, Agent, or Firm*—Sutherland Asbill & Brennan LLP

(57) ABSTRACT

The present invention provides for low cost discrete inductor devices in an all organic platform. The inductor devices can utilize virtually any organic material that provides the desired properties, such as liquid crystalline polymer (LCP) or polyphenyl ether (PPE), in a multilayer structure, wherein the organic materials have low moisture uptake and good temperature stability. Each layer may be metalized and selectively interconnected by vias formed in respective layers so as to form winding or coiled inductors. The inductor devices may advantageously include external shielding formed by metalizing the side walls and top surface of the inductor devices on in-built shielding achieved by the utilization of the hybrid co-planar waveguide topologies. The inductor devices can be configured for either ball grid array (BGA)/chip scale package (CSP) or surface mount device (SMD) mounting to circuit boards.

9 Claims, 20 Drawing Sheets

U.S. PATENT DOCUMENTS

| | | |
|---|---|---|
| 5,545,916 A | 8/1996 | Koullias |
| 5,559,360 A | 9/1996 | Chiu et al. |
| 5,610,433 A * | 3/1997 | Merrill et al. ............... 257/531 |
| 5,635,892 A | 6/1997 | Ashby et al. |
| 5,654,681 A | 8/1997 | Ishizaki et al. |
| 5,668,511 A | 9/1997 | Furutani et al. |
| 5,679,414 A | 10/1997 | Akashi et al. |
| 5,703,544 A | 12/1997 | Hays, III |
| 5,716,663 A | 2/1998 | Capote et al. |
| 5,719,354 A | 2/1998 | Jester et al. |
| 5,719,539 A | 2/1998 | Ishizaki et al. |
| 5,720,898 A | 2/1998 | Nohira et al. |
| 5,739,193 A | 4/1998 | Walpita et al. |
| 5,770,986 A | 6/1998 | Tonegawa et al. |
| 5,801,100 A | 9/1998 | Lee et al. |
| 5,818,313 A | 10/1998 | Estes et al. |
| 5,844,299 A | 12/1998 | Merrill et al. |
| 5,917,244 A | 6/1999 | Lee et al. |
| 5,955,931 A | 9/1999 | Kaneko et al. |
| 5,999,243 A | 12/1999 | Kameyama et al. |
| 6,005,197 A | 12/1999 | Kola et al. |
| 6,008,102 A | 12/1999 | Alford et al. |
| 6,021,050 A | 2/2000 | Ehman et al. |
| 6,026,286 A | 2/2000 | Long |
| 6,031,727 A | 2/2000 | Duesman et al. |
| 6,040,226 A | 3/2000 | Wojnarowski et al. |
| 6,051,289 A | 4/2000 | Tsujimoto et al. |
| 6,093,599 A | 7/2000 | Lee et al. |
| 6,114,925 A | 9/2000 | Lo |
| 6,127,905 A | 10/2000 | Horie |
| 6,153,290 A | 11/2000 | Sunahara |
| 6,166,799 A | 12/2000 | Kameyama et al. |
| 6,171,716 B1 * | 1/2001 | Sasaki et al. ............... 428/692 |
| 6,177,853 B1 | 1/2001 | Nagatomi et al. |
| 6,191,666 B1 | 2/2001 | Sheen |
| 6,191,669 B1 | 2/2001 | Shigemura |
| 6,225,696 B1 | 5/2001 | Hathaway et al. |
| 6,249,962 B1 | 6/2001 | Bergstedt |
| 6,255,714 B1 | 7/2001 | Kossives et al. |
| 6,259,037 B1 | 7/2001 | Feilchenfeld et al. |
| 6,259,148 B1 | 7/2001 | Bartush et al. |
| 6,261,872 B1 | 7/2001 | Hathaway et al. |
| 6,281,430 B1 | 8/2001 | Lupo et al. |
| 6,287,931 B1 | 9/2001 | Chen |
| 6,303,423 B1 | 10/2001 | Lin |
| 6,380,608 B1 | 4/2002 | Bentley |
| 6,395,374 B1 | 5/2002 | McAndrew et al. |
| 6,421,225 B2 | 7/2002 | Bergstedt |
| 6,445,266 B1 | 9/2002 | Nagatomi et al. |
| 6,492,886 B1 * | 12/2002 | Kushitani et al. ........... 333/204 |
| 6,528,732 B1 | 3/2003 | Okubora et al. |
| 6,583,687 B2 * | 6/2003 | Nosaka ....................... 333/175 |
| 6,625,037 B2 | 9/2003 | Nakatani et al. |
| 6,713,162 B2 * | 3/2004 | Takaya et al. ............... 428/209 |
| 2001/0004228 A1 | 6/2001 | Hirai et al. |
| 2001/0016980 A1 | 8/2001 | Bergstedt |
| 2001/0050599 A1 | 12/2001 | Maekawa et al. |
| 2002/0008301 A1 | 1/2002 | Liou et al. |
| 2002/0048930 A1 | 4/2002 | Lin |
| 2002/0064701 A1 | 5/2002 | Hand et al. |
| 2002/0064922 A1 | 5/2002 | Lin |
| 2002/0074158 A1 | 6/2002 | St. Lawrence et al. |
| 2002/0076538 A1 | 6/2002 | St. Lawrence et al. |
| 2002/0081443 A1 | 6/2002 | Connelly et al. |
| 2002/0158305 A1 | 10/2002 | Dalmia et al. |
| 2002/0172021 A1 | 11/2002 | Seri et al. |
| 2002/0195270 A1 | 12/2002 | Okubora et al. |
| 2004/0034489 A1 | 2/2004 | Ogino et al. |

FOREIGN PATENT DOCUMENTS

| | | |
|---|---|---|
| EP | 0506476 B1 | 5/1996 |
| EP | 0510971 B1 | 3/1997 |
| EP | 1 235 235 A1 | 8/2002 |
| EP | 1 411 553 A1 | 4/2004 |
| JP | 09 130103 | 10/1995 |
| JP | WO01/97582 A1 | 12/2001 |
| WO | WO 01/95679 | 12/2001 |

OTHER PUBLICATIONS

Alvin L.S. Loke, et al., "Evaluation of Copper Penetration in Low-κ Polymer Dielectrics by Bias-Temperature Stress," MRS Spring Meeting, Symposium N/O, Paper O4.4, San Francisco, CA, Apr. 7, 1999.

Wang, et al., "A Full-Wave Analysis Model for Uniplananr Circuits with Lumped Elements," IEEE Transactions on Microwave Theory and Techniques, vol. 51, No. 1, Jan. 2003.

www.sbir.gsfc.nasa.gov/SBIR/successes/ss/110text.html; Liquid Crystal Polymers for Printed Wiring Boards.

www.yamaichi.us/yflex.html; Flexible Printed Circuit—YFLEX.

Hong, J.S. et al., "Filters for RF/Microwave Applications," Wiley-Interscience Publication, 2001, pp. 121-159.

Son, M.H. et al., Low-Cost Realization of ISM Band Pass Filters Using Integrated Combline Structures, 2000, (4 pages).

Matijasevic, G. et al., "MCM-L Substrates Fabricated Using Patterned TLPS Conductive Composites," 1997 International Conference on Multichip Modules, Apr. 2, 1997, pp. 64-69.

Charles, H.K., "Packaging With Multichip Modules," 1992 IEEE/CHMT Int'l Electronics Manufacturing Technology Symposium, pp. 206-210.

Min, S.H. et al., "Design, Fabrication, Measurement and Modeling of Embedded Inductors in Laminate Technology," ASME International Electronic Packaging Technical Conference and Exhibition, Jul. 8-13, 2001, pp. 1-5.

Dalmia, S. et al., "Modeling RF Passive Circuits Using Coupled Lines and Scalable Models," 2001 Electronic Components and Technology Conference, pp. 816-823.

Patent Abstracts of Japan vol. 1995, No. 09, Oct. 21, 1995.

* cited by examiner

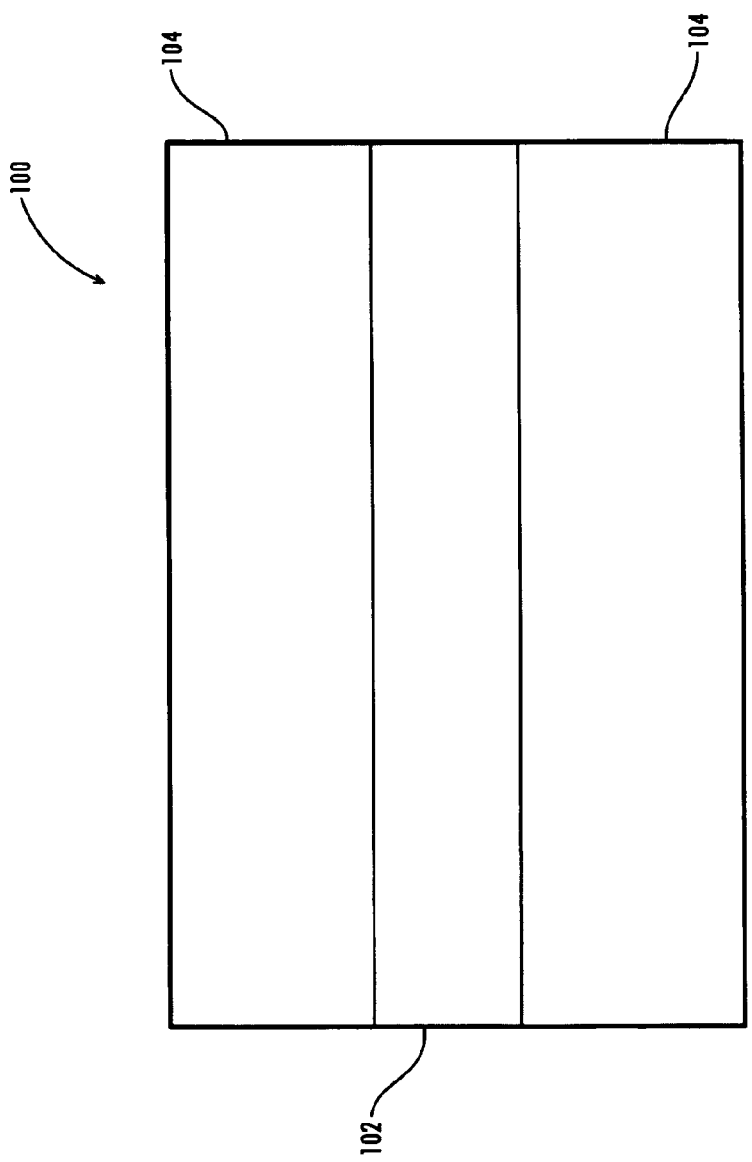

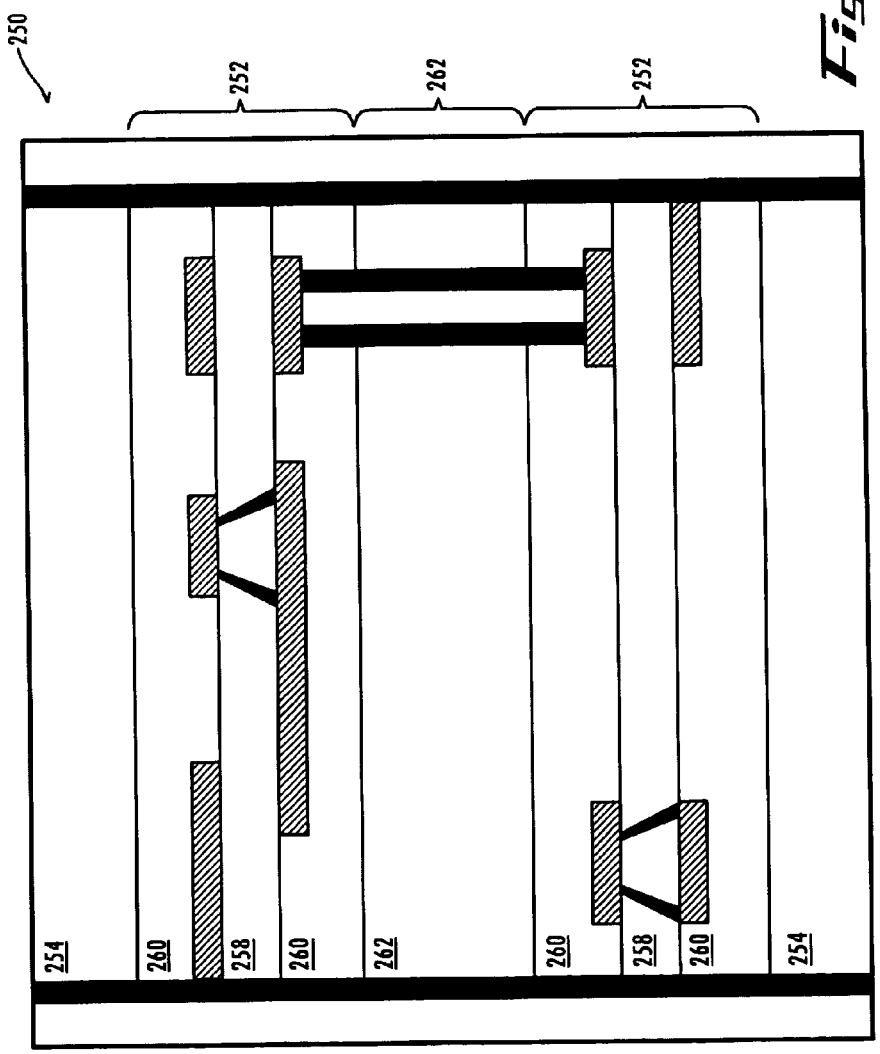

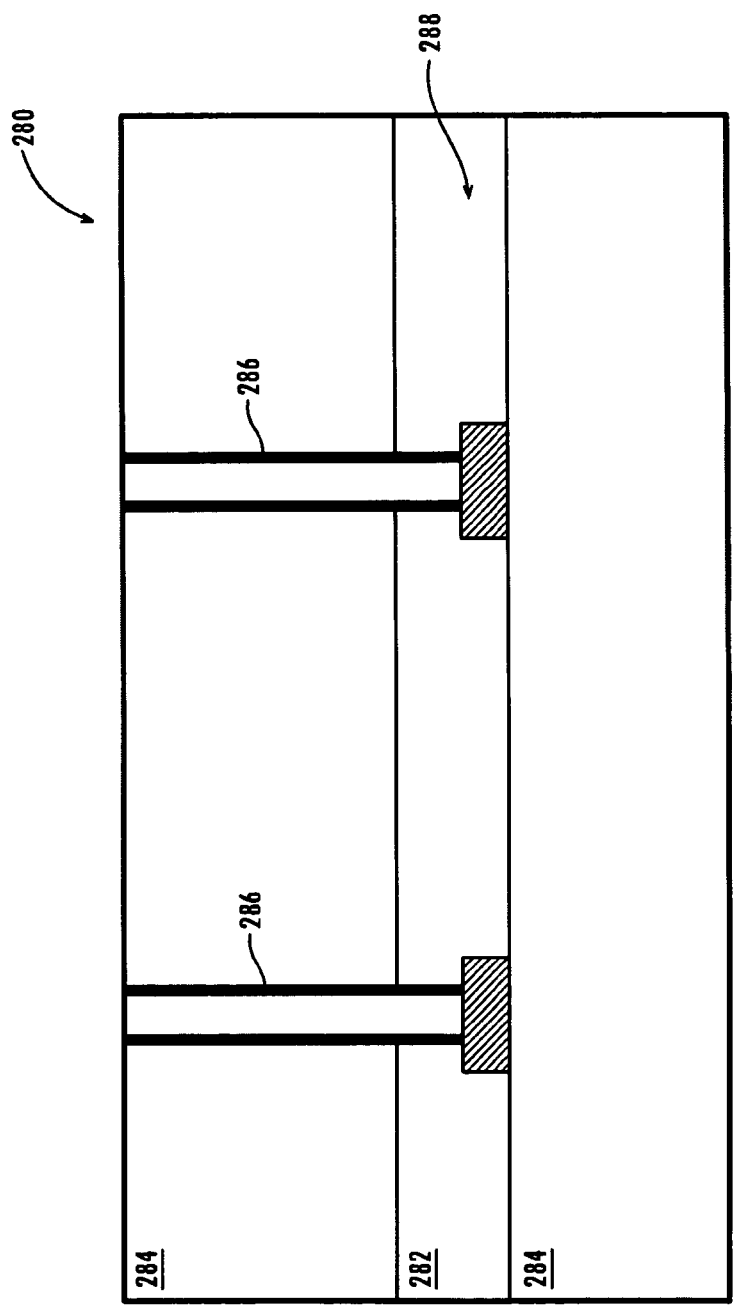

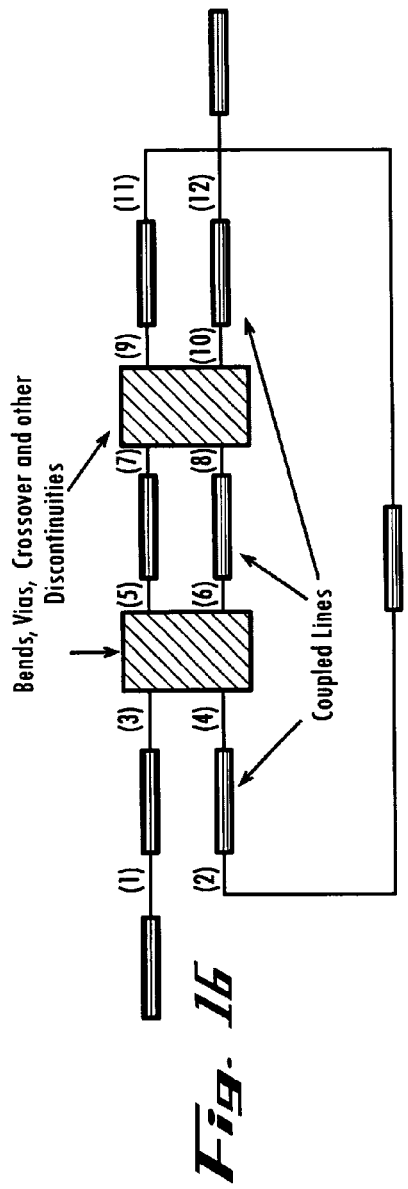
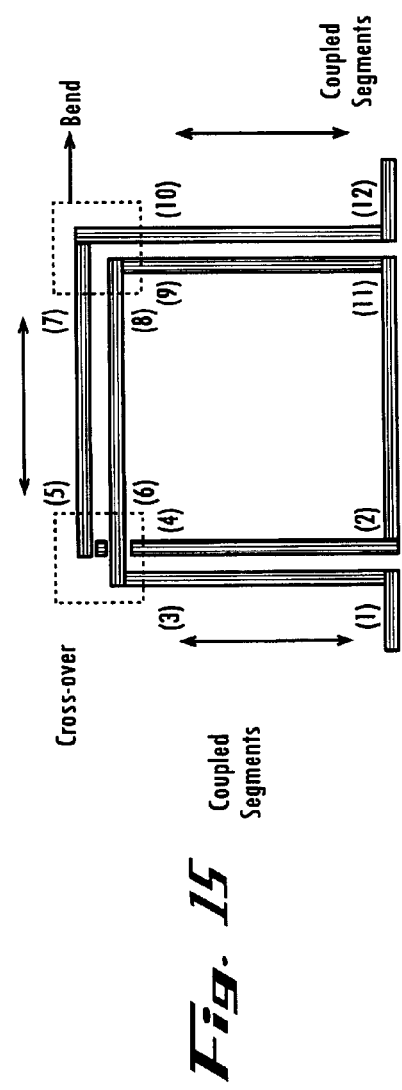

STAND-ALONE ORGANIC-BASED PASSIVE DEVICES

STATEMENT OF GOVERNMENT INTEREST

The work that led to this invention has been supported in part by a grant from the U.S. Army, Contract No. DAAH01-99-D-R002-0032. Thus, the United States Government may have certain rights to this invention.

CROSS-REFERENCE TO RELATED APPLICATION

This application is related to the following co-pending, commonly assigned U.S. applications, each of which is entirely incorporated herein by reference: "Methods for Fabricating Three-Dimensional All Organic Interconnect Structures" filed Mar. 28, 2003, and accorded application Ser. No. 10/402,315; and "Integrated Passive Devices Fabricated Utilizing Multi-Layer, Organic Laminates" filed Mar. 28, 2003, and accorded application Ser. No. 10/402,313.

TECHNICAL FIELD

The present invention is generally related to integrated passive devices formed as discrete components for use on circuit boards and, more particularly, is related to multilayer organic passive devices, such as inductors, for use in broadband applications.

BACKGROUND OF THE INVENTION

Integrated circuit technology is very advanced in the area of discrete surface mount passive components (i.e., resistors, capacitors, and inductors). For example, this technology is very popular in mixed signal designs, such as, for portable wireless electronics and other devices in which digital and radio frequency (RF) circuits are combined into mixed signal modules. However, as the size of electronic devices decreases, it has become increasingly important for designers to optimize the available real estate on mixed signal chip modules. For instance, in some mixed signal designs, off-chip passive components use more real estate on the boards than the analog and digital signal processing units. By providing smaller passive components, designers may more efficiently use available real estate on boards or reduce the size of the boards themselves. Therefore, the development of relatively smaller passive components suitable for mounting to printed wiring boards has become increasingly important.

The use of existing systems and methods for implementing integrated passive components, however, may be problematic for several reasons. It is important to model the behavior of passive components, which are constituents in critical components such as filters, couplers, phase locked loops, etc., extremely accurately and in a reasonable processing time. The trade off of speed versus accuracy is one that has always plagued designers. Accordingly, it is a goal of the design community to develop solutions that are fast and accurate for modeling integrated components. Besides the difficulty in modeling integrated passives, the presence of severe parasitic effects in silicon-based RF IC's makes the design of high Q reactive components difficult. Q factor refers to the measure of "quality" of a particular frequency response. Therefore, it is advantageous to design integrated passive components having a high Q. Low temperature co-fired ceramic (LTCC) technology for multi-chip modules (MCMs) used in RF and wireless systems is one solution to this design problem of designing high Q integrated passive components. However, LTCC is an extremely expensive process to implement for consumer applications because of the complexity of the high-temperature fabrication process and/or the expense of the ceramic materials used in the substrates.

With specific regard to inductors, they form an integral part of filters, resonators, baluns, matching networks and bias networks. Inductors are commercially available as off-chip discrete components fabricated using multilayer ceramic substrates. Their construction generally has been limited to multilayer ceramic substrates because the ceramic materials used are resilient to moisture and temperature and show little variation with these parameters, which is imperative for inductors used in high frequency applications. There are essentially three types of ceramic inductors that are available in discrete form: winding internal construction, multilayer ceramic, thin film. The general properties of these inductors are provided below in Table 1.

TABLE 1

Prior Art Ceramic Inductors

| Structure | Features | Suitable applications | Sizes |
| --- | --- | --- | --- |
| Winding Internal Construction | High Q; Large current capacity (750 mA); low tolerance (>25% variance), low yield; Physically large | IF Impedance matching; RF Oscillation circuit; IF Choke; Circuits where large currents flow; Circuits where high Q characteristics | (2.0 × 1.5 mm) to (3.2 × 1.6 mm) |
| Multilayer Ceramic | Low current capacity (450 mA); Inexpensive; Good high-frequency-range characteristics | RF/IF impedance matching; RF oscillation circuit; RF choke | (1.0 × 0.5 mm) to (1.6 × 1.8 mm) |
| Thin Film | Physically small and thin; low current capacity (450 mA); Low L deviation; | RF/IF Impedance matching; RF Oscillation | (0.6 × 0.3 mm) to (1.0 × 0.5 mm) |

TABLE 1-continued

Prior Art Ceramic Inductors

| Structure | Features | Suitable applications | Sizes |
|---|---|---|---|
| | Good high-frequency-range characteristics; high tolerance (2–5% variance); high yield; Expensive | circuit; RF Choke; Circuits requiring tight inductance tolerance | |

None of the above-noted inductor designs provides a suitable combination of low cost, high yield, and high current. In addition, these designs do not provide in-built shielding, and therefore, if shielding is desired it must be added once mounted to the circuit board, typically in the form of a can or by adding references adjacent or below the device, which adds to the complexity of modeling the device (e.g., reduces quality factor). Alternatively, modeling the component and then modeling the circuit board with the component is very complex, as discussed in Wang et al., "A Full-Wave Analysis Model for Uniplanar Circuits With Lumped Elements," IEEE Transactions on Microwave Theory and Techniques, Vol. 51, No. 1, pp. 207–215, January 2003.

Additionally, the high temperatures associated with the processing of ceramic-based inductors adds process complexity and thereby increases cost. Commercial manufactures currently utilize an automated system for a 5"×5" wafer. Although the use of ceramic substrates for packages with embedded components and attached chips has been performed, it currently cannot be used for the replacement of an entire board for commercial wireless applications. LTCC modules are almost always mounted on a larger ceramic carrier, which is generally processed using organic thin-film laminate technology, which is currently automated for 18"×24" wafers. This involves three levels of packaging, which is relatively expensive compared to other prior art inductors.

As an alternative to ceramic-based designs, organic materials have been utilized with varying degrees of success. The loss tangent for the dielectrics used in organic processes is typically anywhere from 0.02 for epoxy-based materials to as low as 0.0005 for teflon-based materials. Cost is crucial for widespread acceptance of a material, and epoxy-glass laminate is the lowest cost material and consequently holds a large market share in package substrates and printed wiring boards. However, these organic dielectrics exhibit frequency dependent elecrtrical behavior that is not suitable for broadband applications. Additionally, they have high moisture uptake and show high variance with temperature. On the other hand, materials such as teflon based composites, which exhibit resilience to temperature and moisture, are expensive and difficult to process. For example, currently the hardness of the teflon based composites, such as polytetra flouroethylene (PTFE), makes it difficult to fabricate small vias and through holes for selectively defining intra-layer connectivity because the PTFE melts from the high concentration of heat generated by the mechanical drill and then shatters. In addition, it is currently difficult to make multilayer structures out of PTFE because of its inertness. Those multilayer structures that comprise PTFE do not include layer-to-layer selective interconnectivity, but rather, are limited to through holes that extend from the top layer to the bottom layer.

Thus, there is a need in the industry for low-cost, high performance inductors for use in broadband applications.

SUMMARY OF THE INVENTION

The present invention provides for low cost, and if desired high performance, discrete inductor devices in an all organic platform. The integrated passive devices (IPDs) of the present invention utilize a low cost organic material such as liquid crystalline polymer (LCP) or polyphenyl ether (PPE) in a multilayer structure, wherein the organic materials have low moisture uptake and good temperature stability. Each layer may be metalized on one or both sides and selectively interconnected by vias formed in the respective layers so as to form winding or coiled inductors. Utilizing photolithographic techniques, tolerances within 2% can be obtained, with inductances of 0.1 nH and greater can be achieved with unloaded Qs from 30–700 at frequencies in the megahertz to multiple gigahertz range. The passive devices may advantageously utilize novel hybrid topologies (e.g., coplanar waveguide (CPW)/stripline or CPW/microstrip), which reduce the number of processing steps, can be sealed to an 18"×24" wafer, and provide in-built shielding. In certain embodiments, external shielding formed by metalizing the side walls is utilized. The passive devices can be configured for either ball grid array (BGA)/chip scale package (CSP) or surface mount device (SMD) mounting to circuit boards.

Briefly described, an embodiment of the present invention as a stand-alone inductor device for mounting to a circuit board comprises a first conductive layer, a first substrate layer comprising an organic material formed on a first surface of the first conductive layer, a second conductive layer formed on a first surface of the first substrate layer and comprising an inductor, which exposes portions of the first substrate layer, a bond ply layer formed on the second conductive layer and exposed portions of the first substrate layer, a second substrate layer comprising a second organic material formed on the bond ply layer opposite the second conductive layer and first substrate layer, and a third conductive layer formed on a first surface of the second substrate layer opposite the second conductive layer.

The inductor can be configured in a hybrid coplanar waveguide/stripline topology. The first conductive layer and third conductive layer can operate as ground references for the transmission line, and the inductor may comprises shielding on at least two opposite sides of the inductor, wherein the side shielding is in-built or external. The first organic material and the second organic material can comprise one of liquid crystalline polymers, polyphenyl ether-based materials and hydrocarbon composites, and epoxy/glass composites. Further, the second conductive layer comprises a layer of conductive material having a substantially uniform thickness greater or equal to 5 microns, and the total thicknesses of the first and second substrate layers can be greater than approximately 5 mils.

In accordance with another embodiment of the present invention, a discrete inductor device for mounting to a circuit board comprises a first conductive layer, a first substrate layer comprising an organic material formed on a first surface of the first conductive layer, a second conductive layer formed on a first surface of the first substrate layer and comprising an inductor, which exposes portions of the first substrate layer, a bond ply layer formed on the second conductive layer and exposed portions of the first substrate layer, a second substrate layer comprising a second organic material formed on the bond ply layer opposite the second conductive layer and first substrate layer, shielding on at least two opposite sides of the inductor device, and wherein the inductor is configured in a coplanar waveguide/microstrip topology. The side shielding can be in-built or external, and the first conductive layer and third conductive layer operate as ground references for the transmission line. The first organic material and second organic material can comprise one of liquid crystalline polymers, polyphenyl ether-based materials and hydrocarbon composites, and epoxy/glass composites. The second conductive layer can comprise a layer of conductive material having a substantially uniform thickness of between 15 microns to 50 microns, and the thicknesses of the first and second substrate layers can be greater than approximately 20 mils. Lastly, the first conductive layer and shielding can operate as ground references for the transmission line.

In accordance with another embodiment of the present invention, a stand-alone inductor device comprises a device component comprising a first organic substrate on which at least one inductor is formed, a first core layer of organic material adjacent the device component, and side shielding on at least two sides of the inductor to provide a single ground reference. The stand-alone inductor can further comprise a second core layer disposed adjacent the device component, opposite the first core layer. The device component layer can comprise a plurality of organic substrates bonded together, wherein each organic substrate includes at least one inductor, wherein at least two of the plurality of organic substrates are electrically interconnected by a via. The stand-alone inductor can further comprise a second device component comprising a second organic substrate on which at least a second inductor is formed, the second device component is disposed adjacent the core layer, opposite the device layer. The device component and second device component can be electrically connected by a via in the core layer. The side shielding can comprise external layers of conductive material, or alternatively, the side shielding can comprise in-built layers of conductive material fabricated on the same plane as the inductor.

In accordance with another embodiment of the present invention, a method for fabricating a stand-alone inductor device comprises fabricating a wafer comprising a plurality of all organic inductor devices, at least one inductor device comprising a device component including a first organic substrate on which at least one inductor is formed, and a first core layer of organic material adjacent the device component. The method further comprise forming trenches along two opposing sides of at least one inductor device integrated in the wafer, metalizing the trenches, and singulating the inductor devices so as to form stand-alone inductor devices with external side shielding formed from the metallization of the trenches.

In accordance with another embodiment of the present invention, a method for fabricating a stand-alone inductor device comprises fabricating a wafer comprising a plurality of all organic inductor devices, at least one inductor device comprising a device component including a first organic substrate on which at least one inductor is formed, in-built side shielding on at least two sides of an inductor integral the inductor device. The method further comprises a first core layer of organic material adjacent the device component, forming trenches along two opposing sides of at least one inductor device integrated in the wafer, and singulating the inductor devices so as to form stand-alone inductor devices.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 1 is a schematic illustration of an embodiment of an all organic integrated passive device according to an embodiment of the present invention.

FIG. 15 illustrates an example of an integrated passive component which may be designed, modeled, and/or optimized using the integrated passive components design/optimization system of FIGS. 13 and 14.

FIG. 16 illustrates a coupled-line representation of the integrated passive component of FIG. 15.

DETAILED DESCRIPTION

I. Organic Substrate for Integrated Passive Components

FIG. 1 is a schematic illustration of an embodiment of an all organic integrated passive device 100 packaged in a stand-alone configuration in accordance with an embodiment of the present invention. The device 100 comprises a device component 102 sandwiched between two shielding and packaging components 104. The device component 102 may comprise a single layer or multiple layers of low cost, high performance organic material metalized on one or both sides to form one or more passive devices, such as inductors, as discussed in more detail below. The shielding and packaging components 104 may comprise external shielding, particularly if the device component 102 does not provide in-built shielding, and/or one or more relatively thick and rigid structural layers, also referred to as core layers. The shielding and packaging layer 104 may comprise a single layer or multiple layers of material, as discussed in more detail below.

As will be understood with reference to the description that follows, the all-organic device 100 enables the design and fabrication of very low-cost stand-alone passive devices, such as inductors having a high Q factor. As described in more detail below, the integrated passive device or devices of the device component 102 are preferably configured in a hybrid topology, such as a coplanar waveguide (CPW) microstrip, or a CPW stripline, in accordance with the present invention.

The organic material utilized in at least some of the layers of the device component 102 may comprise any low cost organic material, though preferably a low cost, high performance organic material. By way of example, the layers may comprise any of the following types of organic materials: polyphenyl ether (PPE) based materials, such as LD621 from Polyclad and N6000 series from Park/Nelco Corporation, liquid crystalline polymer (LCP), such as LCP from Rogers Corporation or W. L. Gore & Associates, Inc., hydrocarbon composites, such as 4000 series from Rogers Corporation., and epoxy-based laminates, such as N4000 series from Park/Nelco Corp. These materials provide excellent hermiticity and temperature independence, which emulates the performance of ceramic substrates used to construct multilayer ceramic components such as the inductors mentioned in Table 1.

Figure 2H:
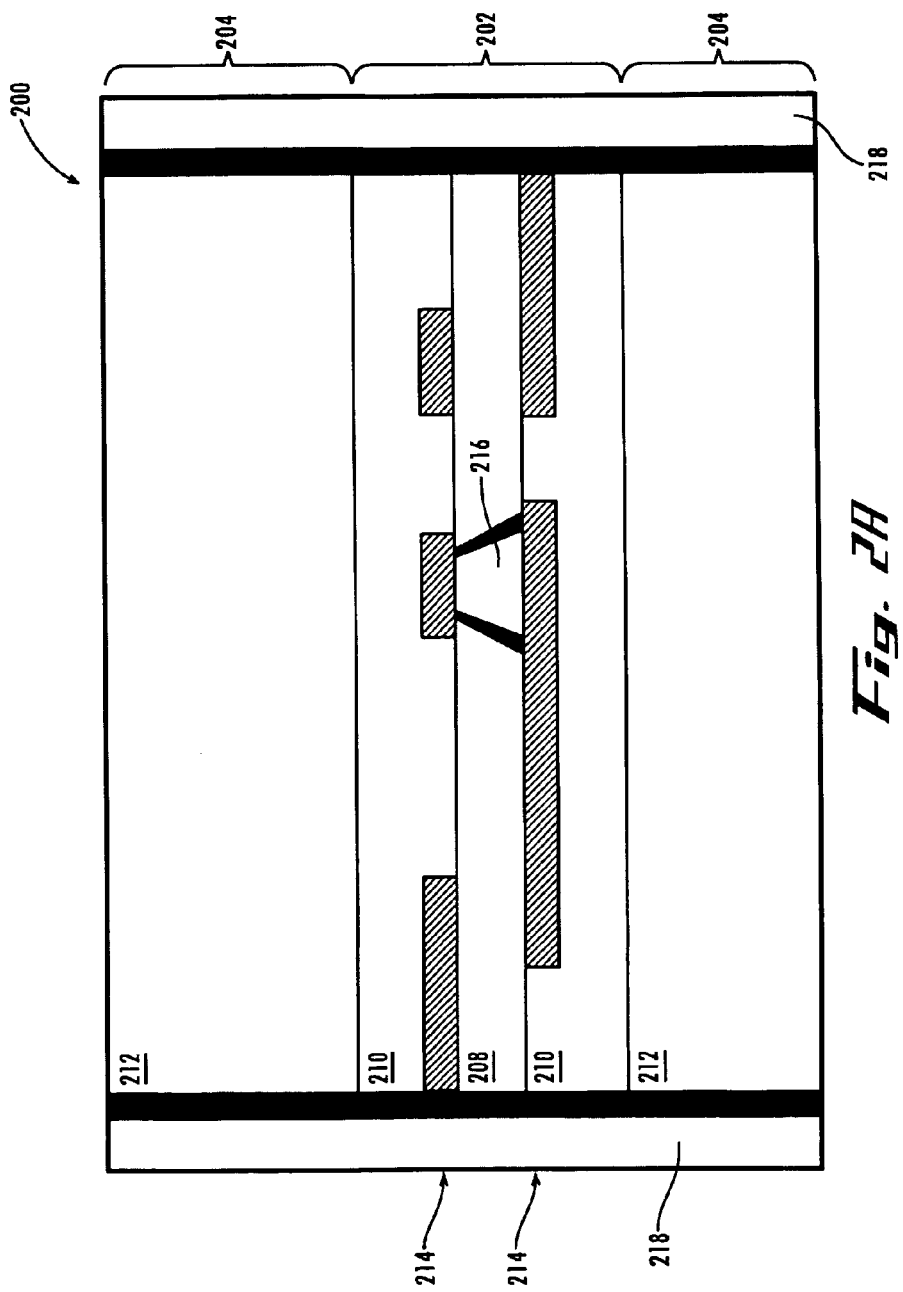
FIGS. 2A–C are cross-sectional views of three illustrative embodiments of the packaging of a multi-layer organic structure according to an embodiment of the present invention.

FIG. 2A illustrates a cross-sectional view of an embodiment of a multilayer all organic device 200 in accordance with the present invention. The device 200 comprises a device component 202 sandwiched between two shielding and packaging components 204. The device component 202 comprises a metalized organic dielectric layer 208 and two bond ply layers 210. The bond ply layers 210 (also referred to as prepreg) may comprise Speedboard from W. L. Gore & Associates, Inc. or Roger 4350 from Rogers Corporation. While the device component 202 only shows one metalized organic substrate layer, the device component may comprise multiple metalized layers, which can be metalized on one or both sides, that are stacked with bonding material interposed between the metalized layers as needed for bonding the layers together. For example, thermoset materials, like bond ply or prepreg, can be utilized. Alternatively, one could alternate layers of high and low temperature thermoplastics, or utilize a combination of thermosets and thermoplastics. The device 200 is particularly well suited for mounting to a circuit board using surface mount device (SMD) techniques, as discussed in more detail below. The shielding and packaging components 204 comprise relatively thicker organic core layers 212, and as desired, shielding on one or more external surfaces of the device.

The metalized organic dielectric layer 208 of the device component 202 preferably comprises a 25 µm thick layer of LCP or another suitable organic material, wherein the LCP layer comprises a patterned electroplated conductor layer 214 on both sides to form the conductor of the inductor. The conductor layers 214 may comprise electroplated copper metal fabricated on the underlying substrate layer. While the conductor layers 214 in FIG. 2A are shown in a simple pattern in order to illustrate the invention, the present invention is not limited to any particular conductor design, though it is preferred that the conductor take one or a combination of the designs discussed in pending patent application, application Ser. No. 09/995,161, filed on Nov. 26, 2001, the entire disclosure of which is incorporated by reference, or one of the designs illustrated in FIGS. 11A–D discussed below.

In an embodiment, conductor layers 214 comprise a layer of 25 µm electroplated copper metal. One of ordinary skill in the art will appreciate that the thickness of the conductor layers may vary depending on design constraints. Furthermore, conductor layers 214 may comprise other types of metals and/or other types of conducting materials and may be fabricated on the substrate layers in various alternative ways. The conductor layers 214 on the opposing sides of the organic dielectric layer 208 may be interconnected by one or more vias 216, which can be formed by a drill, laser or etch solution. Plated through holes 218 can be placed along the outer edge of the stand-alone device so that the singulation of the device dissects the through holes to form input/output ports for the device.

The bond ply layers 210 sandwich the metalized dielectric layer 208 and facilitate a bond between the dielectric layer 208 and the core layer 212. The core layers 212 preferably comprise a 36 mils thick layer of a hydrocarbon composite. Suitable materials for the bond ply layers 210 include any uncured organics such as epoxy/glass composites, PPE, hydrocarbon composites, and prepreg, and other suitable materials for the core layers 212 include cured organics such as epoxy/glass composites, PPE, hydrocarbon composites and prepreg. It should be noted that the organic materials comprising the various layers of the multilayer device 200 may all be a thermostat or thermoplastic, or they may be a combination of the two as described above. The organic materials selected may be chosen advantageously to thermally match or closely match adjacent material layer and/or the outer layer of the device 200 to the substrate on which it is mounted.

With reference to FIG. 2B, an alternative configuration of a multilayer all-organic device 250 is illustrated in a cross-sectional view. In this embodiment, the device component comprises two device components 252 that are sandwiching a relatively thick core layer 262, which provides the structural rigidity for the device 250. Additional structural rigidity and packaging is provided by shielding and packaging components 254. The device components 252 may comprise one or more metalized organic dielectric 258 sandwiched between two bond ply layers 260. This embodiment is particularly well-suited for a stand-alone device mounted using SMD techniques, as discussed in more detail below.

With reference to FIG. 2C, yet another alternative configuration of a multilayer all-organic device 280 is illustrated in a cross-sectional view. In this embodiment, a device component 282 is sandwiched between two core layers 284 that comprise the shielding and packaging. In this embodiment, the device component layer comprises bond ply and the component layer inductor comprises a patterned metalized layer 288 formed in a single plane (as opposed to having conductor elements on multiple planes) on one of the core layers comprising the packaging component. The two core layers are bonded together by the bond ply layer, which is generally noted as the device component 282. Through holes 286 provide for connectivity to other layers or to the external bump pads on which solder bumps can be formed. This embodiment is particularly well-suited for a stand-alone device mounted using BGA/CSP techniques, as discussed in more detail below.

It should be noted that the embodiments of FIGS. 2A–2C are merely illustrative, and should not be viewed as limiting the present invention. The particular configuration of the device component 102 as a one or multiple layers, sandwiching or being sandwiched by core layers, should not be limited by the examples of FIGS. 2A–2C.

In accordance with an aspect of the present invention, the low cost organic materials (such as PPE and LCP) utilized to fabricate the inductors include thick copper metallization (e.g., greater than 10 $\mu$m) to sustain high current flow. Utilizing photolithography techniques, tolerances within 2% for inductances upwards of 0.1 nH can be achieved with unloaded Qs ranging from as low as 30 to as high as 700 at frequencies from hundreds of megahertz to multiple gigahertz. Additionally, the inductor devices are configured in novel topologies such as hybrid coplanar waveguide (CPW)/stripline and CPW/microstrip, which provides in-built shielding, as illustrated in FIGS. 3A–3D and discussed in greater detail below. In general, the hybrid topologies define the configuration of the inductors which leverages the organic process using the lower cost organic materials that can be processed using fewer steps, and can be automated for at least an 18"×24" wafer to leverage the economies of scale.

The quality determining component of an inductor is the characteristic impedance, $Z_o$, of the lines used to comprise the inductor. The conductor loss in an inductor is inversely proportional to $Z_o$ of the line, and represents the dominant loss in the device provided the loss in the dielectric used in the construction is below a certain threshold value of about 0.02. The characteristic impedance of these lines can be determined based on the inductance and capacitance per unit length, which can be computed based on the distance from the reference plane. Since voltage is not an absolute term like charge or current, it has to be referenced to a standard which is commonly called the ground plane. For the prior art ceramic inductors described in Table 1, the performance is determined by assuming the ground to be infinitely far away, which being impractical in most applications, has to be re-determined for realistic situations where the ground/reference is a finite distance away. This results in additional design time and interference due to the presence of other components which might be present in the electrical vicinity of the device.

The present invention avoids the problems associated with modeling ground for a discrete stand-alone inductor mounted to a circuit board of tens to hundreds of other passive and active electrical components by providing internal or external shielding, thereby defining ground independent of the inductor's surroundings. An inductor in accordance with the present invention includes a ground reference by having a multi (>2) terminal device, wherein two terminals can be the ground layer and the other two terminals can be the input and output terminals. This helps alleviate the concerns when using a standard two terminal device, such as those described in Table 1. The hybrid topologies of FIGS. 3A–3D also allow for additional shielding on the sides of the device to help restrict the energy within the device.

Figure 3A:
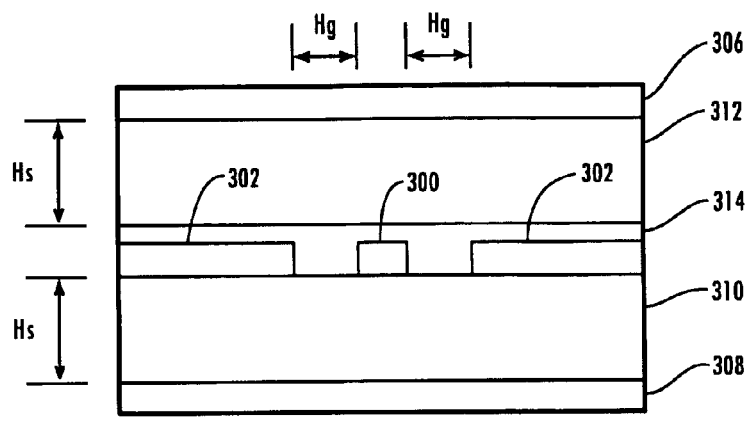
FIGS. 3A–3D are cross-sectional views of hybrid topologies of a multi-layer structure according to the present invention.
Figure 3B:
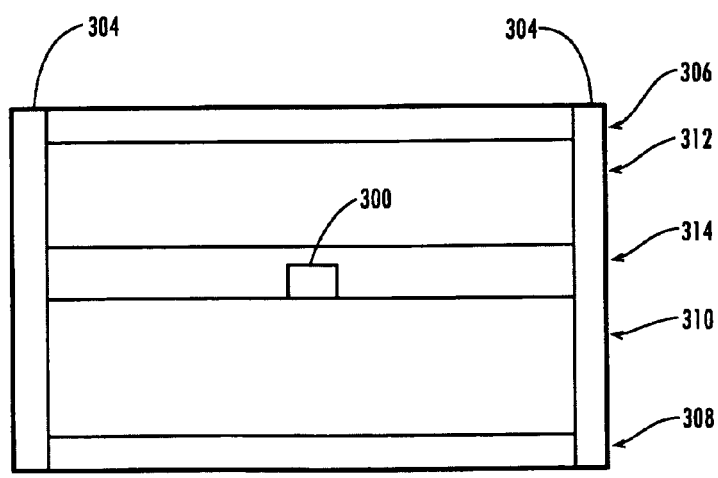
Figure 3C:
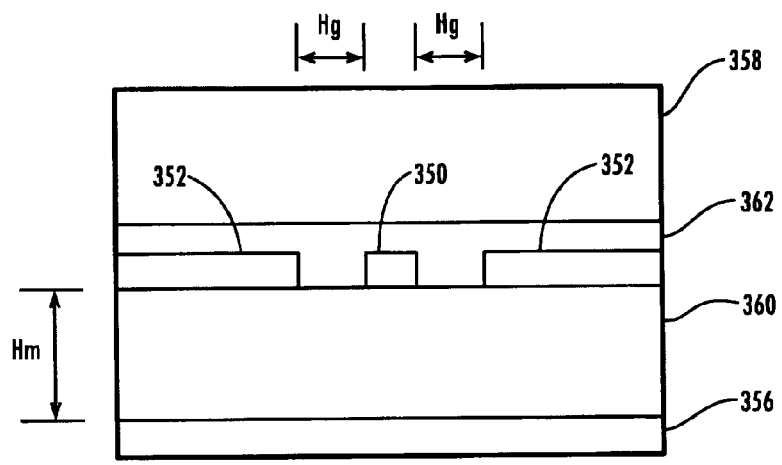
Figure 3D:
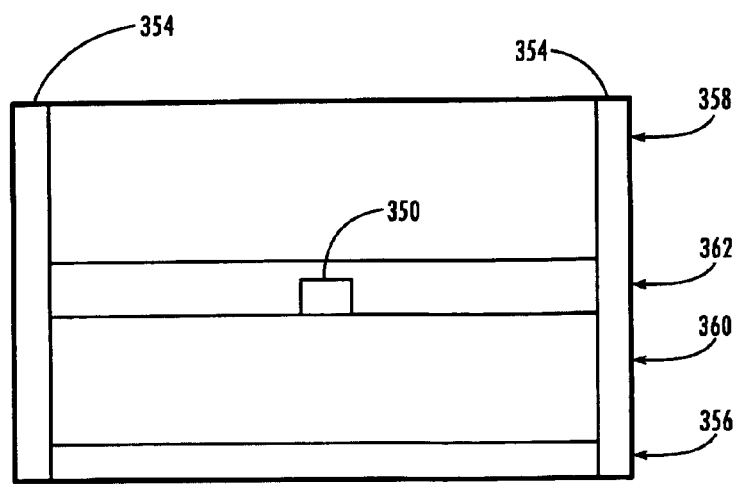

With reference to FIGS. 3A–3D, various hybrid topologies in accordance with aspects of the present invention are illustrated. FIGS. 3A and 3B illustrate CPW/stripline configurations, wherein FIG. 3A includes in-built side shielding and FIG. 3B includes external side shielding. The CPW/stripline topologies are particularly well-suited for mounting to a substrate or circuit board by SMD techniques. In each, the conductor 300 is substantially surrounded by shielding, such as by in-built side shielding 302 or external side shielding 304 and ground layers 306, 308. For illustrative purposes, the conductor 300 is formed on an organic core 310. The organic core 310 and a core layer 312 sandwich a bond ply layer 314. FIGS. 3C and 3D illustrate CPW/microstrip configurations, wherein FIG. 3C includes in-built side shielding and FIG. 3D includes external side shielding. The CPW/microstrip topologies are particularly well-suited for mounting to a substrate or circuit board by BGA or CSP techniques. In each, the conductor 350 is surrounded on five sides by a reference ground, and the sixth side is shielded by the substrate to which it is mounted. As with the CPW/stripline topologies, side shielding is provided by in-built side shielding 352 in FIG. 3C and external side shielding 354 in FIG. 3D. The side shields are electrically connected with a ground layer 356. An organic core 360, on which the conductor is formed, and a core layer 358 sandwich a bond ply layer 362.

For an inductor, performance is often measured by the Q factor. The further apart the signal from the ground, the higher the impedance, which lends itself to a higher current carrying capability and a higher Q. In the hybrid topologies of the present invention, the separation between the coplanar ground and signal line (Hg) is arbitrary and can be chosen to be as large as required. However, Hs and Hm are not arbitrary and both need to be greater than or equal to Hg. To achieve Q's >500, Hg is required to be approximately 30 mils with conductor widths greater than 10 mils, which implies Hs or Hm is to be greater than or equal to 30 mils. In a multilayer ceramic process, this thickness is can be achieved by stacking up several layers which are typically less than 8 mils. In an organic process, such thick cores are available with typical cores being 20 mils, 28 mils, 40 mils, etc. Moreover, organics have an intrinsically lower permittivity that helps reduce the capacitance and increase impedance of the lines. Lastly, conductor thicknesses of 35 µm are easily achievable in organic processes, as compared to 5 µm in ceramic processing. The relative thick conductor of the inductors of the present invention contributes to an increased quality factor by lowering resistive losses and advantageously allows the device to carry currents as high as the winding internal construction inductors in Table 1.

Figure 4:
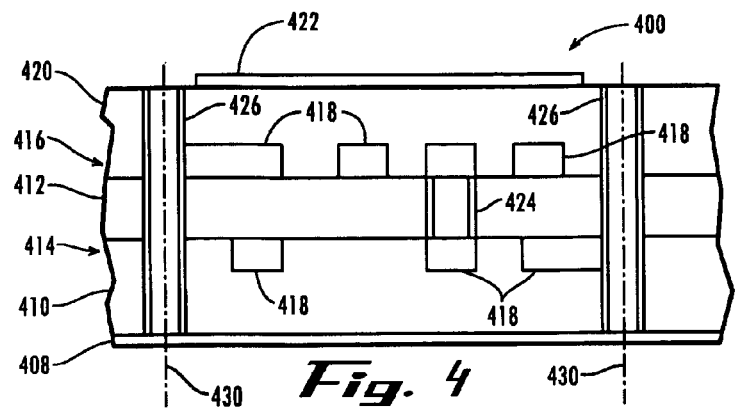
FIG. 4 is a cross-sectional view of an inductor device in accordance with an embodiment of the present invention.
Figure 5:
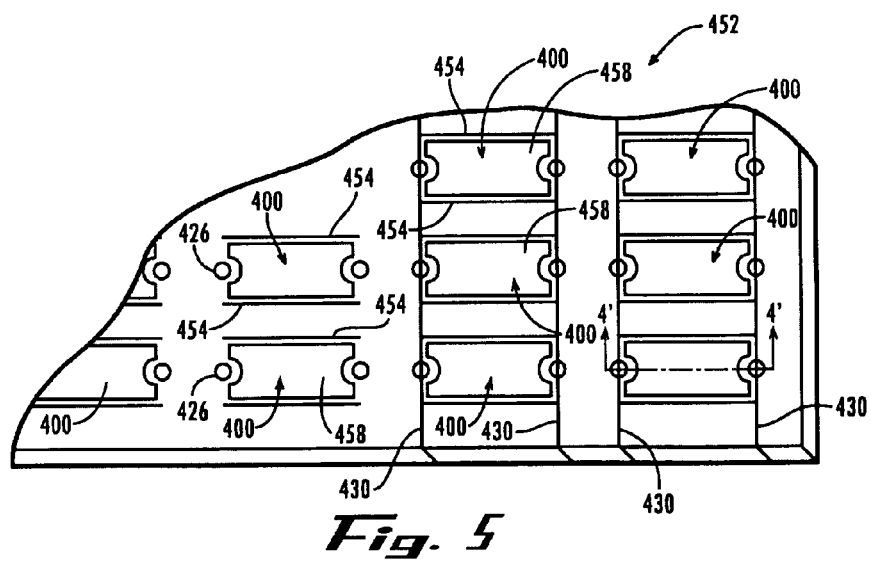
FIG. 5 is a top plan view of a wafer having a plurality of inductor devices in accordance with an embodiment of the present invention integrally formed therein, said inductor devices configured for surface mounting to a circuit board.

FIG. 4 is a cross-sectional view of an inductor 400 taken along lines 4'—4' of FIG. 5 in accordance with an embodiment of the present invention. The cross-sectional view shows the construction of an inductor formed on a wafer for singulation into discrete stand-alone inductor device. The inductor 400 comprises a ground plane conductive layer 408 on which an organic substrate layer 410 is disposed. A diclad organic layer 412 comprising conductive layers 414 and 416 is disposed on the upper surface of the organic substrate layer 410. The conductive layers 414, 416 are patterned to form conductive elements of a meandoring coil conductor 418. In alternative embodiments, the diclad organic layer 412 may comprise a single clad layer, multiple single clad layers or multiple diclad layers, so as to form a single inductor or multiple inductors and other passive devices. A third organic substrate layer 420 is disposed on the diclad organic 412. While not illustrated in FIG. 4, each of organic substrate layers 410 and 420 includes a prepreg layer to facilitate bonding between the organic substrate layers 410, 420 and the diclad organic layer 412. A conductive layer 422 is disposed on the third organic substrate, and may operate as a ground plane if desired.

The conductive elements formed in conductive layers 414, 416 are interconnected by one or more vias 424 in the second organic substrate. The vias 424 can be formed by etching or drilling a void and then plating or filling the void with a conductive material such as copper/nickel-gold. The via is preferably formed prior to lamination of the substrates, and during lamination the dielectric to metal and dielectric to dielectric fusion bonds are formed in a single step, and then the metal to metal melting bonds are formed in a subsequent heating.

The inductor and other passive devices formed by the conductive layers are connected to two or more terminals formed by plated through holes 426. The cut lines 430 for singulating the inductor 400 pass through the through holes, as illustrated. Such plated through holes may be fabricated with a laser or mechanical drill.

Although the dimensions of the conductive layers and substrate layers may vary depending on the performance desired, intended use, materials utilized, etc., a particular embodiment will be described with reference to FIG. 4. For example, in cross-section, the conductive layers 408, 414, 416 and 422 may each comprise a layer of electroplated copper metal having a thickness greater than or equal to 20 µm. The organic substrate layers 410, 412 and 420 may each comprise a layer of LCP or other organic material having a thickness of 1 mil, and the core layer that may comprise at least a layer of hydrocarbon composite, epoxy/glass composite or PPE having a thickness greater than or equal to 20 mil. The vias and through holes are preferably copper plated.

Figure 6:
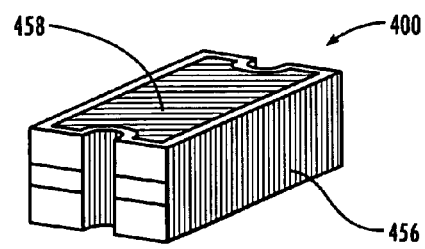
FIG. 6 is a stand-alone inductor device in accordance with an embodiment of the present invention, which may have been singulated from the wafer of FIG. 5.

In production, inductors 400 can be fabricated by the lot on a single substrate and then singulated. For example, a wafer 452 comprising a plurality of inductors 400, as illustrated in FIG. 5, can be singulated into stand-alone inductor devices 400, as illustrated in FIG. 6. Initially, the wafer is fabricated by adhering, preferably by lamination, a plurality of metalized organic substrates with patterned metalized layers with x-axis interconnecting vias and through holes formed therein. Next, parallel trenches 454 are formed to define the opposing side walls of the inductors. The trenches can be routed using a drill bit or cut out using a laser or saw. In one embodiment, the trenches are plated to form a side shielding layer 456 on opposing sides of the inductors. The inductors can then be singulated by cutting (e.g., with a saw or router) the wafer along lines 430, thereby intersecting the trenches 454 and through holes 426, thereby individually releasing the inductors from the wafer. Advantageously, the plated side walls and top conductive layers 458 provide external shielding for the inductor 400. This not only confines the electrical energy of the inductor 400, thereby preventing interference with other circuit bound components, it shields the inductor from external electrical noise. As previously discussed, this drastically reduces the processing required to model the performance of the inductor when mounted to a circuit board. The stand-alone inductor 400 released from wafer 452, as illustrated in FIG. 6, can be mounted to a circuit board, for example, utilizing SMD technology.

Figure 7:
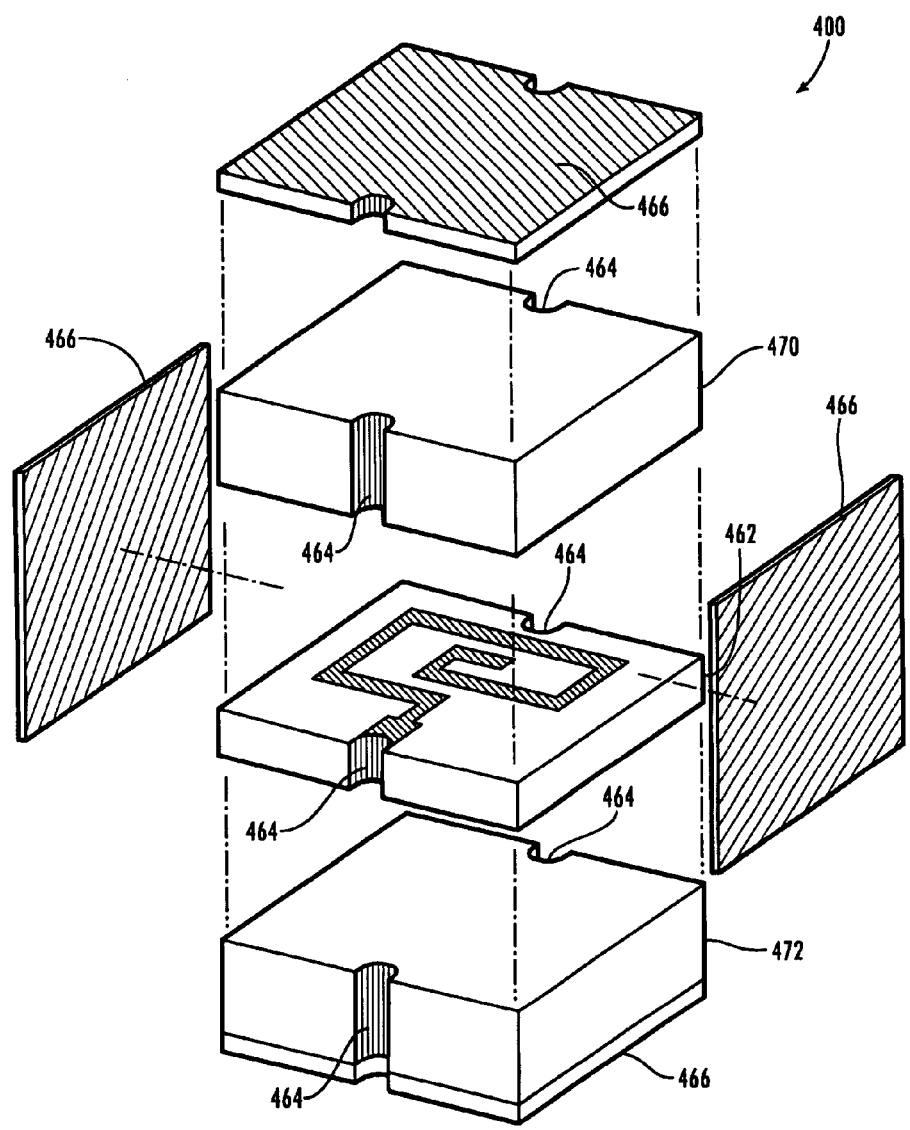
FIG. 7 is an exploded view of the inductor device of FIG. 6.

FIG. 7 is an exploded view of a stand-alone inductor device, such as the one of FIG. 6. While metallization is only viewable on the upper surface of the organic layer 462, it is noted that the organic substrate layer 462 may be metalized on one or both planar surfaces and/or comprise multiple stacked metalized organic substrate layers that form one or more inductors and other passive components, as desired. If desired, vias can be formed in the organic substrate layer 462 to selectively interconnect the conductive elements formed on opposite surfaces or between the layers, providing for the fabrication of multiple passive devices. The passive devices are connected to the portion of the metalized through hole 464 that remains after singulation, which forms the terminals of the stand-alone device. Shielding 466 provides a ground reference and electrically isolates the operation of the enclosed passive device(s). While not illustrated in FIG. 7, each of the organic substrate layers 470, 472 may include a prepreg layer to facilitate the bonding of the organic substrate layers 470, 472 to the organic substrate layer 462.

Figure 8:
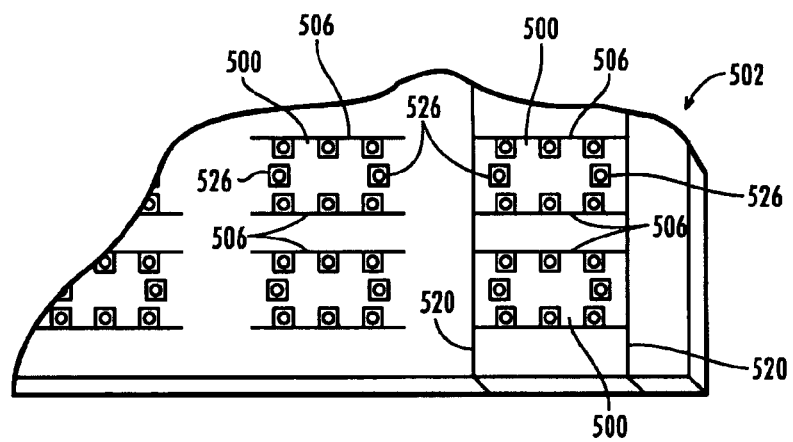
FIG. 8 is a top plan view of a wafer having a plurality of inductor devices in accordance with an embodiment of the present invention that are integrally formed therein, said inductor devices configured for BGA/CSP mounting to a circuit board.
Figure 9:
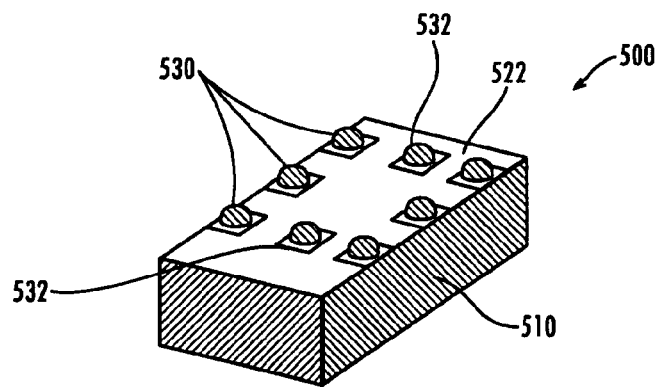
FIG. 9 is a stand-alone inductor device in accordance with an embodiment of the present invention, which may have been singulated from the wafer of FIG. 8.

In an alternative embodiment, inductors can be fabricated into a stand-alone device particularly well suited for mounting to a circuit board using BGA/CSP technology. For example, a plurality of inductors 500 can be fabricated by the lot on a wafer 502, as illustrated in FIG. 8. The construction of the inductors 500 will be similar to that of inductor 400 of FIG. 4 with several exceptions including, for example, the relative location of the through holes to the cut line and the addition of a solder mask layer of the top conductive layer. Parallel trenches 506 are formed to define opposite side walls of the inductor. If desired, the side walls formed by the trenches can be plated to form a shielding layer 510. To facilitate BGA/CSP mounting, the top surface of the wafer includes solder balls 530, 532 (also known as solder bumps). In order to form the solder balls 530, 532, a desired underbump metallurgy (UBM) is formed on the top surface of the wafer, and then contact pads and the solder bumps (which are in the form of solder pads prior to reflow) are formed on the underbump metallurgy. See, for example, U.S. Pat. No. 5,162,257. On the top surface of the wafer, over a top shielding layer, is a non-wattable solder mask to electrically isolate the solder balls 530, 532 from one another and the underlying shielding layer. The inductors 500 can be singulated by cutting the wafer along lines 520, intersecting trenches 504 to individually release the inductors from the wafer. FIG. 9 shows a stand-alone inductor 500 released from wafer 502. The shielding layer 510, 522 provide shielding to the integrated passive device imbedded within the stand-alone device. The solder balls 530, 532 provide for mechanical and electrical connection to a circuit board using well known flip-chip techniques (e.g., BGA and CSP), and in addition, solder balls 532 provide interconnection to the integrated passive device(s) of the inductor 500.

Figure 10A:
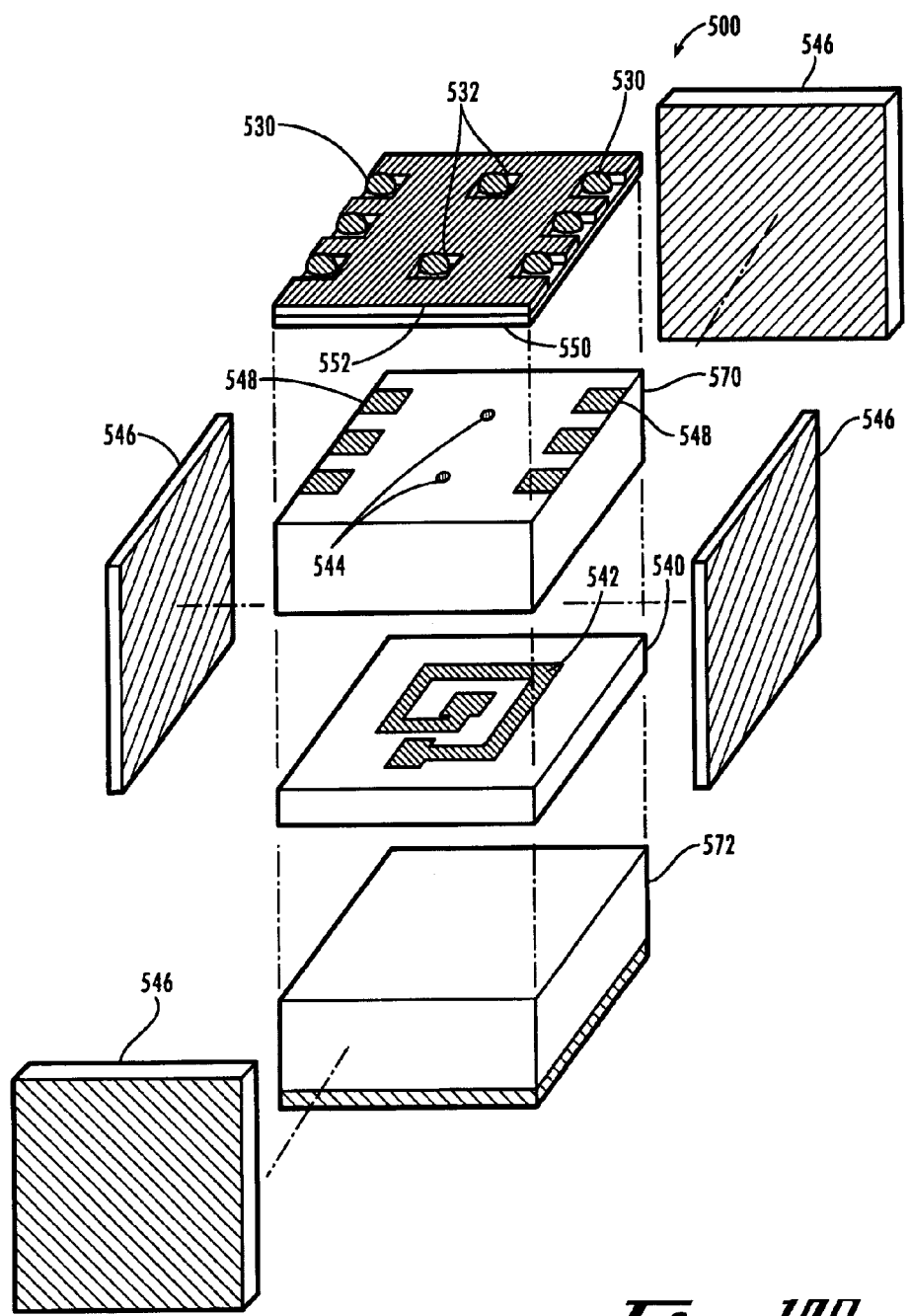
FIGS. 10A–10B are exploded views of the inductor device of FIG. 9 with external shielding and in-built shielding, respectively.

FIG. 10A is an exploded view of the stand-alone inductor device, such as the one of FIG. 9. As with the previous embodiment of FIG. 7, the device component layer 540 may be metalized on one or both planar surfaces and/or comprise multiple stacked metalized layers to form one or more inductors and other passive components, as desired. In the illustrated embodiment, the inductor 542 is electrically connected to the circuit board to which the stand-alone device is mounted by vias 544 and solder bumps 532. The solder balls 530 are electrically connected to the side shielding 546 by pads 548. A top shielding layer 550 is partially covered by a solder mask 552. While not illustrated in FIG. 10A, each of the organic substrate layers 570, 572 includes a prepreg layer to facilitate the bonding of the organic substrate layers 570, 572 to the device component layer 540.

Figure 10B:
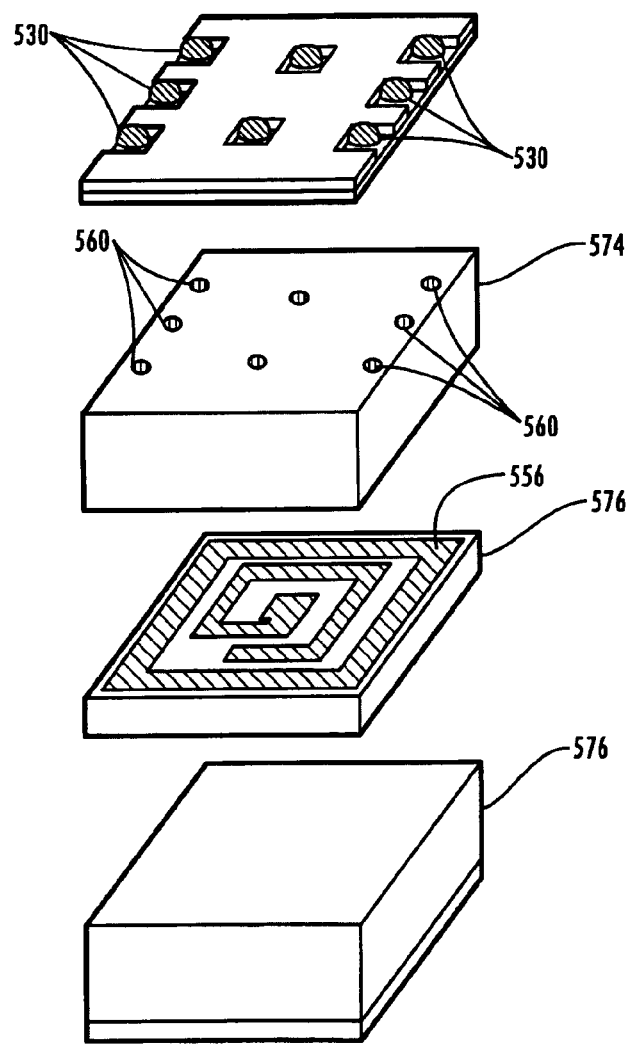

FIG. 10B is an exploded view of an alternative embodiment to that of FIG. 10A, wherein the side shielding is in-built rather external. In particular, the external side shielding is not needed because of the patterned in-built ground ring 556 that is coplanar with the inductor. Additional vias 560 are formed in the core layer 574 to facilitate connectivity between the solder balls 530 and the ground ring 556. Thus, for each plane on which passive devices or portions thereof are formed, a ground is fabricated about the periphery of the substrate. While not illustrated in FIG. 10B, each of the organic substrate layers 574, 576 may include a prepreg layer to facilitate the bonding of the organic substrate layers 574, 576 to the device component layer 576.

Figure 11A:
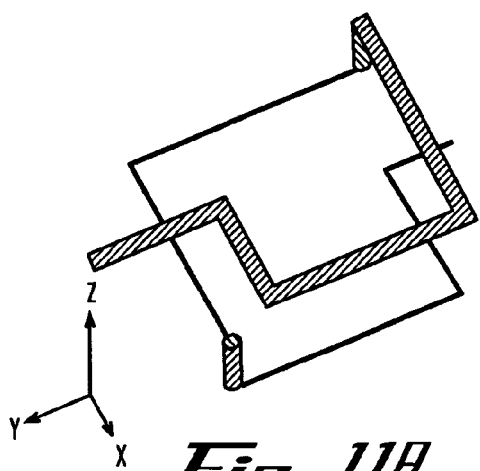
FIGS. 11A–11D are illustrative conductor configurations suitable for incorporation in an inductor device according to the present invention.
Figure 11B:
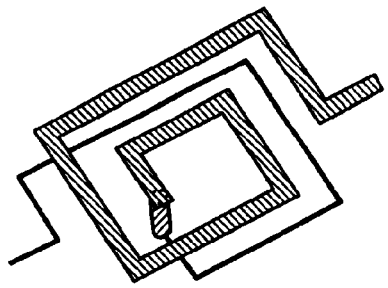
Figure 11C:
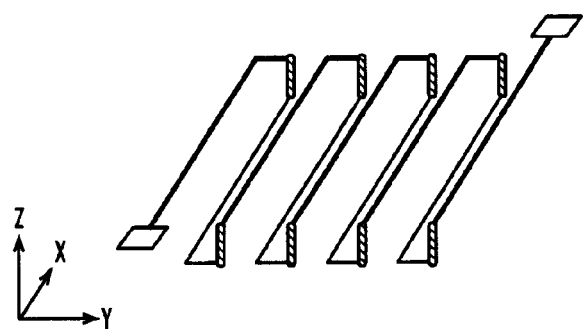
Figure 11D:
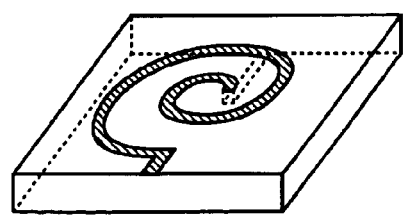

The inductor configurations illustrated thus far have merely been illustrative of the numerous configurations available. Because of the ability to interconnect multiple conductive layers to form spiral and loop inductors in both the x-y plane and z plane, as desired. For example, FIGS. 11A–11D provide illustrative alternative embodiments for the conductor configuration of an inductor in accordance with the present invention. For purposes of clarification, the inductors shown in FIGS. 11A–11D are represented in different widths to denote a different plane on which the inductors resided. That is, the inductors can be fabricated in either a single substrate configuration (i.e., metallization on both sides of the organic substrate) or a multi-substrate configuration (i.e., metallization on one side of each adjacent substrate). With reference to the figures, FIG. 11A shows a three conductor residing on three discrete planes, thereby forming a vertically spiral or loop inductor in the z plane. FIG. 11B shows two spiraling conductors and two discrete planes, FIG. 11C shows a spiral or loop in the x-y plane, and FIG. 11D shows a meandoring spiral on a single plane.

II. Illustrative Methods for Fabricating Stand-Alone Inductors

Figure 12A:
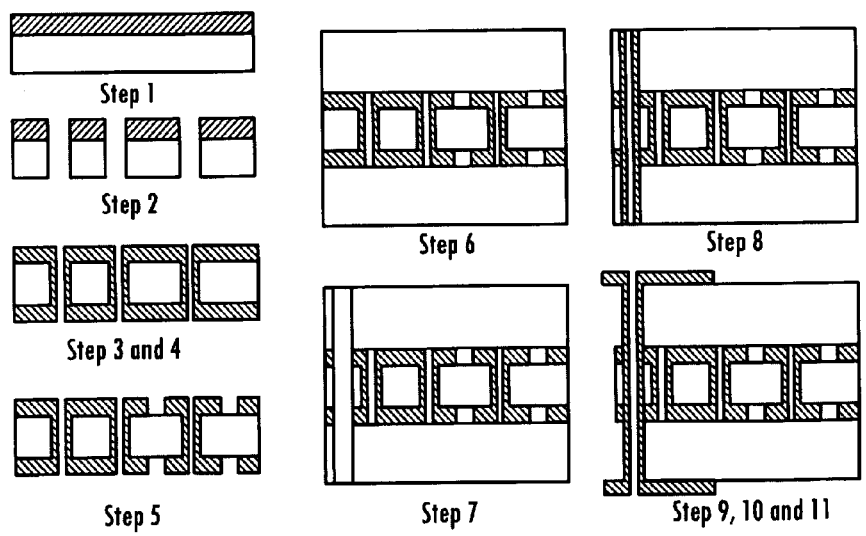
FIGS. 12A–12B are process flow diagrams illustrating low-cost, all organic fabrication processes according to the present invention.

An illustrative process for fabricating an LCP based integrated passive device (IPD), such as the inductor illustrated in FIG. 6, configured as a surface mount device (SMD) in accordance with an embodiment of the present invention is now described with reference generally to FIG. 12A. Initially, a starting material is selected, which is preferably a reinforced or non-reinforced LCP laminate that can be unclad, or cladded with copper on one or both sides of the LCP, as illustrated in Step 1. Alternate materials include other low loss organic laminates like PPE, PTFE composites, hydrocarbon ceramic composites, BT resin composites (e.g., Speedboard C), and thermosets (e.g., Hitachi MCL-LX-67F). Next, vias are drilled through the LCP or other laminate and the layers of copper, as illustrated in Step 2. These microvias can be drilled with mechanical drilling, laser drilling or other suitable methods known to those skilled in the art.

Steps 3 and 4, involve the metallization of the vias and laminate. In additive, semi-additive, or subtractive processes starting with unclad or copper clad LCP or other laminates, both sides of the LCP or other laminate and the vias are seeded using electroless plated, vacuum deposited copper or another deposition method for forming a continuous copper film. To achieve the target metal thickness for the device, electrolytic plating is done to build the copper on both sides of the laminate and in the vias in a single step. The circuit definition for the inductor component can be done using subtractive, semi-additive or fully additive processes with panel or pattern electroplating of copper followed by print and etch steps to define the inductor component of the device layer, as illustrated in Step 5.

The fabricated device circuits are then packaged using vacuum or non-vacuum lamination of LCP or alternate dielectric laminate materials, such as those detailed above in connection with Step 1, and/or Al, Cu, Mo metal (for high power applications) on both sides of the inductor component to a given thickness to encapsulate components, as illustrated in Step 6. The added layers on either side of the inductor component are often referred to as core layers. The internal and external metal layers are connected, as needed, using plated through holes that can be drilled mechanically or with laser, photo, or plasma processes to provide signal and ground connections and SMD terminals, as illustrated in Step 7. The two edges of the device without the through hole are also slotted using mechanical drill/rout/mill, laser cutting, or sawing processes to provide for additional shielding of the device during subsequent metallization. The drilled through holes and shielding slots are seeded with electroless plated or sputter/vacuum deposited copper to provide a bus layer in substantially the same manner as described above in connection with Step 3, as illustrated in Step 8.

With reference to Steps 9, 10, and 11, the final metal thickness for the outer layers is built up by electroplated copper in the through holes, shielding slots, and on the top and bottom surfaces. Subtractive, semi-additive, or additive processes may be used to define the outerlayer ground circuits and SMD terminals for connection with print and etch processing of the copper, as described above in connection with Steps 4 and 5. The device is then finished with terminal metals appropriate for SMD assembly and soldering processes. The finishing metals on the device terminals are common plated metals or alloys like electroless Ni—Au, immersion tin, immersion silver, electroplated Ni—Au, solder (HASL), or organic finishes (OSPs), wherein the choice depends on the intended application.

The fully fabricated wafer (also referred to as panel) is then singulated into individual inductor devices. The singulation can be done using high speed dicing saws or alternate methods such as punching or routing/milling. An advantage of this fabrication process is the ability to fully electrical test the components either before or after singulation.

Figure 12B:
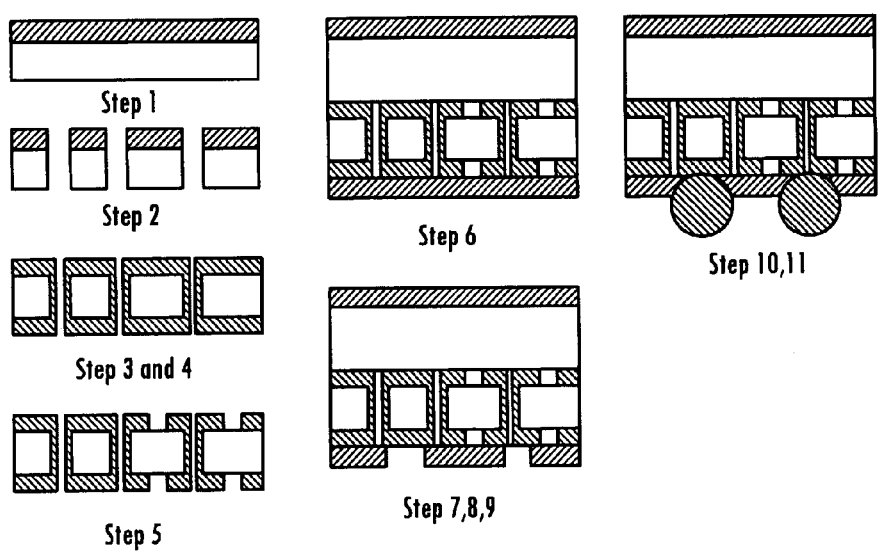

Another illustrative process for fabricating an LCP based IPD, such as the inductor illustrated in FIG. 9, configured as a ball grid array (BGA) or chip scale package (CSP) in accordance with an embodiment of the present invention is now described with reference generally to FIG. 12B. Initially, a starting material is selected, preferably a reinforced or non-reinforced LCP laminate that can be unclad, or cladded with copper foil on one or both sides of the LCP, as illustrated in Step 1. Alternate materials include other low loss organic laminates like PPE, PTFE composites, hydrocarbon ceramic composites, BT resin composites (e.g., Speedboard C), and thermosets (e.g., Hitachi MCL-LX-67F). Next, through vias are drilled through the LCP or other laminate and the layers of copper, as illustrated in Step 2. These microvias can be drilled with mechanical drilling, laser drilling or other suitable methods known to those skilled in the art.

Steps 3 and 4 involve the metallization of the vias and laminate. In additive, semi-additive, or subtractive processes starting with unclad or copper clad LCP or other laminates, both sides of the LCP or other laminate and the vias are seeded using electroless plated, vacuum deposited copper or another deposition method to form a continuous copper film. To achieve the target metal thickness for the device, electrolytic plating is done to build the copper on both sides of the laminate and in the vias in a single step. The circuit definition for the inductor component can be done using subtractive, semi-additive or fully additive processes with panel or pattern electroplating of copper followed by print and etch steps to define the filter circuitry, as illustrated in Step 5.

The fabricated device circuits are then packaged using vacuum or non-vacuum lamination of LCP or alternate dielectric laminate materials, such as those detailed above in connection with Step 1, and/or Al, Cu, Mo metal (for high power applications) on both sides of the inductor component to a given thickness to encapsulate components, as illustrated in Step 6.

On the other side of the inductor component, a cover coat material, liquid photo imagable (LPI) or dry film solder mask is deposited using standard processes such as spin coating, curtain or roller coating, dry film lamination, spray coating and others, as illustrated in Steps 7, 8 and 9. This layer acts as a barrier to solder flow between terminals during subsequent reflow and component assembly. The component terminals are defined by opening windows in the cover coat/solder mask material to open the BGA pads for board level interconnection. This is done with processes such as photolithography or laser ablation. The device is then finished with the deposition of terminal metals appropriate for BGA assembly and soldering processes. The finishing metals on the device terminals are common plated metals or alloys like electroless Ni—Au, immersion tin, immersion silver, electroplated Ni—Au, solder (HASL), or organic finishes (OSPs) and the choice depends on the intended application and compatibility with the solder or other alloy used for device-to-module/PWB interconnection.

With general reference to Steps 10, 11, 12, the interconnects are then formed in the windows defined in Step 8 using Pb/Sn solder, or other lead free solders and metal alloys. Processes such as screen or stencil printing of solder paste and reflow, or plating processes can be used to form the bumps for interconnection. The BGA/CSP format of the filter components enables the testing of the components on the large area board prior to singulation. The testing can be done, for example, with probing techniques or using test sockets or fixtures.

The fabricated wafer is then singulated into individual inductor devices. The singulation can be done using high speed dicing saws or alternate methods such as punching or routing/milling. An advantage of this fabrication process is the ability to fully electrical test the components either before or after singulation.

III. Integrated Passive Component Design/Optimization System

Figure 13:
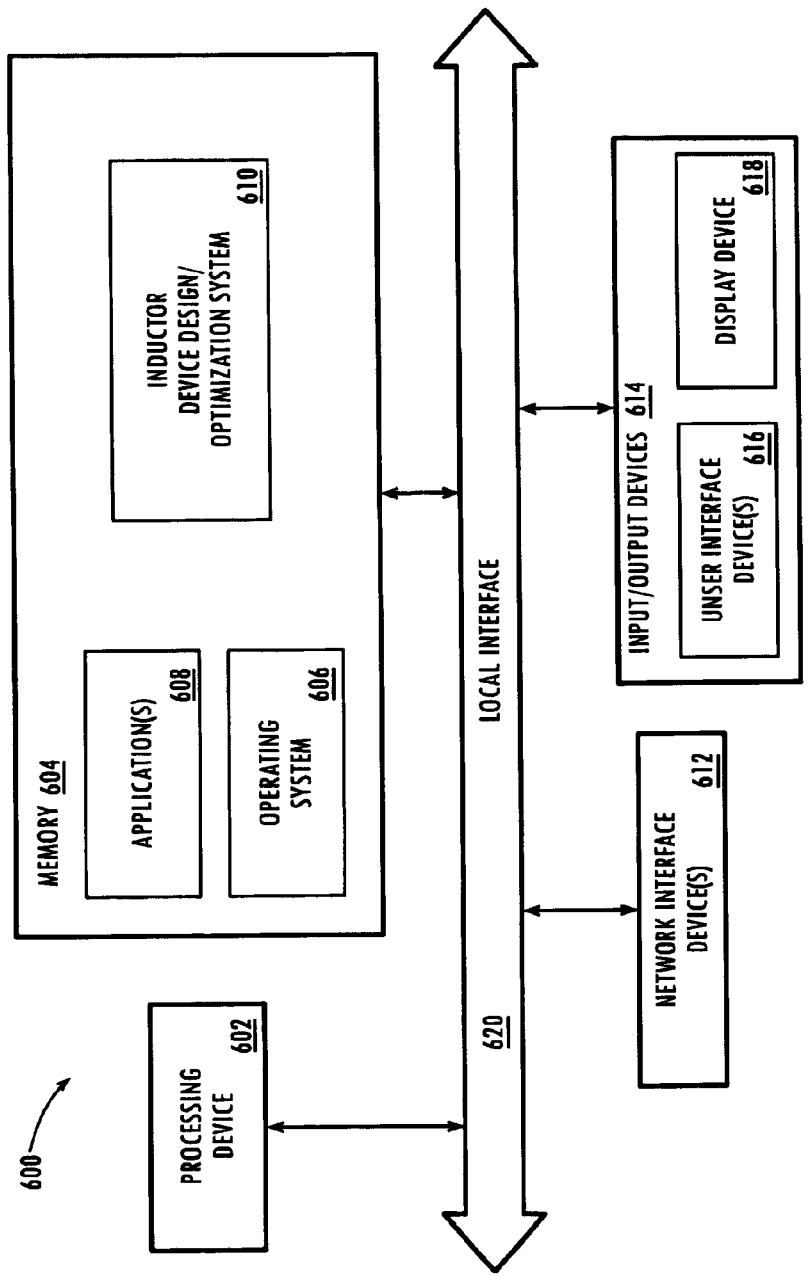
FIG. 13 is a block diagram illustrating an implementation of an embodiment of an integrated passive components design/optimization system according to an embodiment of the present invention for designing, modeling, and/or optimizing integrated passive components.

As stated above, the present invention enables the design of very low-cost, integrated substrates with integrated inductors having a high Q factor. FIG. 13 illustrates a representative computing system 600 in which an embodiment of an inductor device design/optimization system 610 according to the present invention may be implemented. As described in more detail below, in general, inductor device design/optimization system 610 enables a user to design, model, and/or optimize inductors for mounting to circuit boards using SMD or BGA/CSP techniques.

In general, inductor device design/optimization system 610 employs a coupled-line model to model integrated inductors, a segmentation approach to segment the integrated inductor into coupled-line segments and discontinuities, and a simulation tool to compute the impedance matrix of the individual segments and reconstruction of the entire circuit response. Significantly, inductor device design/optimization system 610 enables a designer of integrated components to incorporate imperfections, such as non-uniform signal line profiles, varying dielectric constant, surface roughness in different topologies (i.e., CPW, microstrips, and striplines, etc.), and also maintain the frequency dependence of the models. Furthermore, inductor component design/optimization system also provides designers of inductor devices with layouts for specific passive components on a particular substrate, given certain process parameters and specifications.

Inductor component design/optimization system 610 may be implemented in software, firmware, hardware, or a combination thereof. In the embodiment illustrated in FIG. 13, inductor device design/optimization system 610 is implemented in software, as an executable program, which is executed by a processing device 602. Generally, in terms of hardware architecture, as shown in FIG. 13, computing system 600 comprises a processing device 602, memory 604, one or more network interface devices 612, and one or more input and/or output (I/O) devices 614 interconnected via a local interface 620. System 600 may further comprise additional components not illustrated in FIG. 13.

Referring again to FIG. 13, the various components of system 600 will be described. Local interface 620 may be, for example but not limited to, one or more buses or other wired or wireless connections. The local interface 620 may have additional elements, which are omitted for simplicity, such as controllers, buffers (caches), drivers, repeaters, and receivers, to enable communications. Furthermore, the local interface 420 may include address, control, and/or data connections to enable appropriate communications among the aforementioned components.

Processing device 602 is a hardware device for executing software, particularly that stored in memory 604. Processing device 602 may be any custom-made or commercially-available processor, a central processing unit (CPU), an auxiliary processor among several processors associated with system 600, a semiconductor based microprocessor (in the form of a microchip or chip set), a macroprocessor, or generally any device for executing software instructions.

As illustrated in FIG. 13, memory 604 may comprise an operating system 606, one or more applications 608, and inductor device design/optimization system 610. The architecture, operation, and/or functionality of inductor device design/optimization system 610 will be described in detail below. Memory 604 may include any one or combination of volatile memory elements (e.g., random access memory (RAM, such as DRAM, SRAM, SDRAM, etc.)) and non-volatile memory elements (e.g., ROM, hard drive, tape, CDROM, etc.). Memory 604 may incorporate electronic, magnetic, optical, and/or other types of storage media Furthermore, memory 604 may have a distributed architecture, in which various components are situated remote from one another, but can be accessed by processing device 602.

The software in memory 604 may include one or more separate programs, each of which comprises executable instructions for implementing logical functions. In the example of FIG. 13, the software in memory 604 includes inductor device design/optimization system 610 according to the present invention. Memory 604 may further comprise a suitable operating system 606 that controls the execution of other computer programs, such as one or more applications 608 and inductor device design/optimization system 610, and provides scheduling, input-output control, file and data management, memory management, and communication control and related services.

Inductor device design/optimization system 610 may be a source program, executable program (object code), script, or any other entity comprising a set of instructions to be performed. When implemented as a source program, then the program needs to be translated via a compiler, assembler, interpreter, or the like, which may or may not be included within the memory 604, so as to operate properly in connection with operating system 606. Furthermore, inductor device design/optimization system 610 may be written as (a) an object oriented programming language, which has classes of data and methods, or (b) a procedure programming language, which has routines, subroutines, and/or functions, for example but not limited to, C, C++, Pascal, Basic, Fortran, Cobol, Perl, Java, and Ada. In one embodiment, inductor device design/optimization system 610 is written as C code and implements commercial mathematical software, such as Matlab®.

Network interface device(s) 612 may be any device configured to facilitate communication between system 600 and a communication network, such as a public or private packet-switched or other data network including the Internet, a circuit switched network, such as the public switched telephone network, a wireless network, an optical network, or any other desired communications infrastructure.

Input/output devices 614 may comprise any device configured to communicate with local interface 620. One of ordinary skill in the art will appreciate that, depending on the configuration of system 600, input/output devices 614 may include any of the following, or other, devices: a user interface device 616 (i.e., a keyboard, a mouse, etc.), a display device 618, such a computer monitor, etc., a serial port, a parallel port, a printer, speakers, a microphone, etc. During operation of system 600, a user may interact with inductor device design/optimization system 610 via display device 618 and user interface devices 616.

During operation of system 600, the processing device 602 is configured to execute logic stored within the memory 604, to communicate data to and from the memory 604, and to generally control operations of the system 600 pursuant to the software. Inductor device design/optimization system 610 and operating system 606, in whole or in part, but typically the latter, are read by the processing device 602, perhaps buffered within the processing device 602, and then executed.

In embodiments where inductor device design/optimization system 610 is implemented in software, as is shown in FIG. 13, inductor device design/optimization system 610 may be stored on any computer-readable medium for use by or in connection with any computer related system or method. In the context of this document, a computer-readable medium may be an electronic, magnetic, optical, or other physical device or means that may contain or store a computer program for use by or in connection with a computer-related system or method. Inductor device design/optimization system 610 may be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In alternative embodiments where inductor device design/optimization system 610 is implemented in hardware, inductor device design/optimization system 610 may be implemented with any or a combination of the following, or other, technologies: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Figure 14:
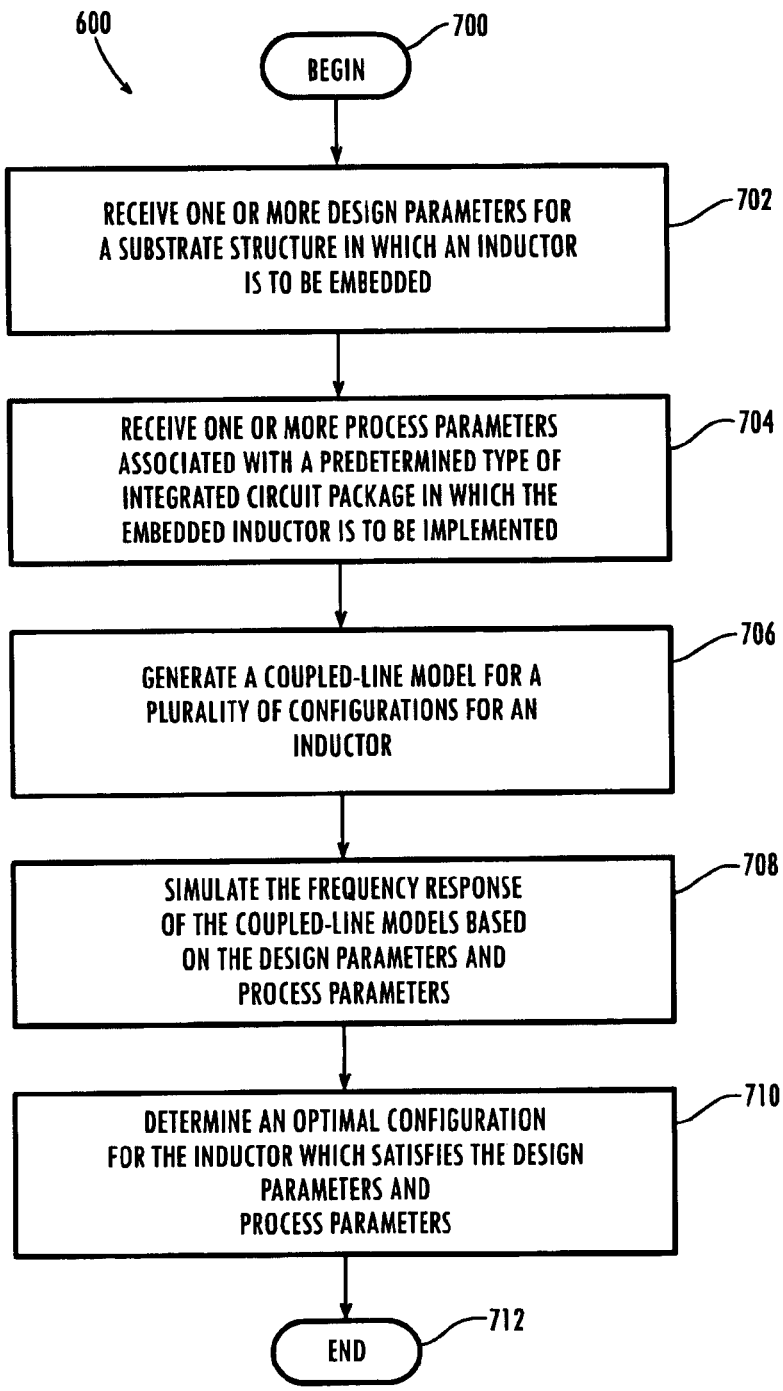
FIG. 14 is a flow chart illustrating an example of the architecture, operation, and/or functionality of the integrated passive components design/optimization system of FIG. 13.

FIG. 14 is a flow chart illustrating the architecture, functionality, and/or operation of an embodiment of inductor device design/optimization system 610. Inductor device design/optimization system 610 begins at block 700. Inductor device design/optimization system 610 may be initiated by a user via an I/O device 614. In alternative embodiments, inductor device design/optimization system 610 may be implemented as a function that may be called by operating system 606 and/or an application 608. In alternative embodiments, the functionality of inductor device design/optimization system 610 may be seamlessly implemented within an application 608.

Regardless of the manner in which inductor device design/optimization system 610 is initiated, at block 702, inductor device design/optimization system 610 may receive one or more design parameters for a substrate structure in which a design component, such as an inductor, capacitor, etc., is to be fabricated. One of ordinary skill in the art will appreciate that the design parameters may vary depending on various design constraints. For example, the design parameters may specify various characteristics of the substrate structure, such as material characteristics, physical characteristics, (i.e., conductor thickness, etc.) and electrical characteristics of the substrate layers and the conductor layers. At block 704, inductor device design/optimization system 610 may receive one or more process parameters (i.e., surface roughness, signal line profile, etc.) associated with a predetermined type of integrated circuit package in which the substrate structure is to be implemented.

Inductor device design/optimization system 610 may be configured to receive the information represented at blocks 702 and 704 in a number of ways. In one embodiment, the information is received via an input/output device 614, for example, by a user via a user interface device 616. The information may also be received via a network interface, device 612 or may be accessed directly from memory 604.

At block 706, inductor device design/optimization system 610 generates a coupled-line model for a plurality of configurations for an inductor. The coupled-line model of the inductor may comprise one or more coupled lines and one or more discontinuities, such as bends, vias, and steps in width of the trace line. In general, inductor device design/optimization system 610 estimates the amount of coupling between integrated passives on the substrate. Inductor device design/optimization system 610 models passive structures with the aid of common multi-line parameters. Inductor device design/optimization system 610 uses a distributed model, which relates the voltages and currents at the start and end of a multiple coupled line section using impedance and admittance matrices.

Inductor device design/optimization system 610 may be used to model symmetric lines, as well as asymmetric lines. For example, the discontinuities in the integrated inductor, such as bends, vias, cross-overs, and steps in width may be modeled using scalable models or analytical equations. Various scalable models are described in S. H. Min, et al., "Design, Fabrication, Measurement and Modeling of Embedded Inductors in Laminate Technology," Proc. Of IPACK, July 2001, which is hereby incorporated by reference in its entirety. Scalable models may be used to provide a mapping between the physical and electrical parameters of the discontinuity, which may be represented using rational functions. In general, the mapping may employ interpolation functions. The use of interpolation functions may minimize the number of sampled data points that are required.

One of ordinary skill in the art will appreciate that the response of integrated passives is dictated by unwanted parasitic effects, which need to be modeled accurately. Coupled lines represent an integral part of integrated passives such as filters, couplers, baluns, etc. However, they also represent an integral part of other passives such as spiral and loop inductors and inter-digital capacitors. For purposes of demonstrating the coupled-line model, FIG. 15 illustrates a 1¾ turn spiral inductor. As shown in FIG. 15, the spiral inductor comprises several coupled line sections cascaded with each other through vias, bends, and cross-overs.

FIG. 16 illustrates a cascaded structure representation of the inductor of FIG. 15, which may be derived using a segmentation approach. The segmentation approach is described in S. Dalmia, et al., "Modeling of Embedded RF Passives Using Coupled Lines and Scalable Modes," IEEE Electronics, Components and Technology Conference (ECTC), May 2001.

The cascaded structure representation comprises a series of coupled lines and discontinuities. The blocks in FIG. 16 represent the discontinuities between the coupled line sections of the inductor. For example, the block between ports 3, 4 and 5, 6 is a crossover and that between 7, 8 and 9, 10 are coupled bends. These discontinuities in the circuit, which may be modeled as electrically short structures at high frequencies, can be modeled using the scalable models described above. The line segments in FIG. 16 represent the multiple coupled line or single uncoupled line sections, which are modeled using the multi-line parameters. One of ordinary skill in the art will appreciate that a multi-mode structure, such as spiral inductors, microstrip loop inductors, and CPW loop inductors, may be segmented as shown in FIG. 16, which enables scalability in the design process. It is worth mentioning that the segmentation approach may be extended to other devices, such as inter-digital capacitors, helical inductors, etc.

Referring again to FIG. 14, at block 708, inductor device design/optimization system 610 simulates the frequency response of the coupled-line models based on the design parameters and process parameters. For instance, a set of 'n' coupled lines may support 'n' independent modes of propagation (called normal modes). Inductor device design/optimization system 610 may be configured to simulate the responses of the coupled lines using quasi-transverse electromagnetic (TEM) lines modes of propagation. The accuracy of this approach improves as the ratio of the wavelength to the thickness of the dielectric increases. For example, a two-dimensional electromagnetic solver, such as ANSOFT 2D.RTM. provides characteristic mode impedances and propagation constants for lossy and lossless lines. The mode impedances and propagation constants may be used to create a distributed model for the multi-line coupled line sections. At least one advantage of using a distributed model is that it prevents artificial ringing induced by lumped circuit equivalents of the multi-coupled lines and may include frequency dependant parameters.

Figure 17:
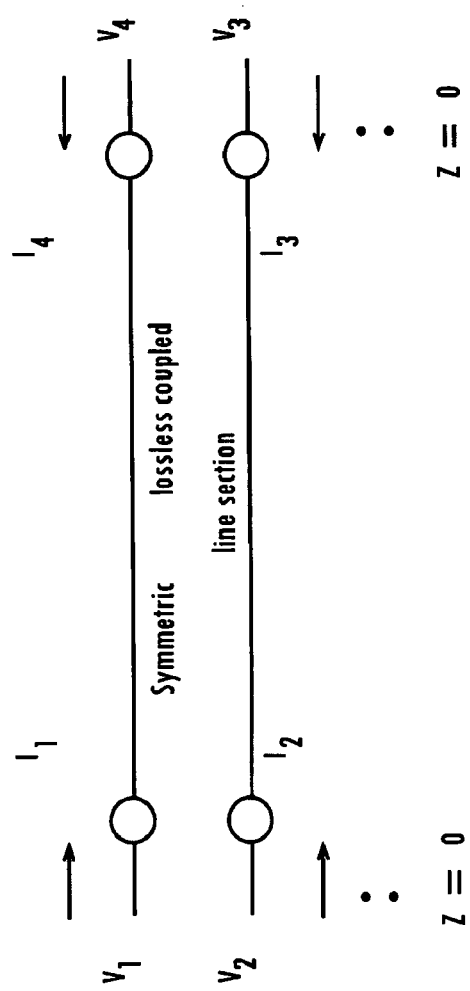
FIG. 17 illustrates a mathematical representation of two symmetric, lossless, coupled lines for the integrated passive component represented in FIGS. 15 and 16.

FIG. 17 illustrates a mathematical representation of two symmetric, lossless, coupled lines, which may be implemented by inductor device design/optimization system 610 to simulate the frequency response of the coupled-line models. One of ordinary skill in the art will appreciate that voltages and currents on a set of 2 symmetric lossless coupled lines of length, l, shown in FIG. 17 may be obtained from the even-mode impedance ($Z_{0e}$), odd-mode impedance ($Z_{0o}$), even-mode propagation constant ($\beta_e$) and odd-mode propagation constant ($\beta_0$) using Equation (1), which follows:

$$\begin{bmatrix} V_1 \\ V_2 \\ V_3 \\ V_4 \end{bmatrix} = \begin{bmatrix} Z_{11} & Z_{12} & Z_{13} & Z_{14} \\ Z_{21} & Z_{22} & Z_{23} & Z_{24} \\ Z_{31} & Z_{32} & Z_{33} & Z_{34} \\ Z_{41} & Z_{42} & Z_{43} & Z_{44} \end{bmatrix} \begin{bmatrix} I_1 \\ I_2 \\ I_3 \\ I_4 \end{bmatrix} \quad (1)$$

where, $Z_{11} = Z_{22} = Z_{33} = Z_{44} = -j(Z_{oe}\cot(\beta_e l) + Z_{oo}\cot(\beta_o l))/2$
$Z_{12} = Z_{21} = Z_{34} = Z_{43} = -j(Z_{oe}\cot(\beta_e l) - Z_{oo}\cot(\beta_o l))/2$
$Z_{13} = Z_{24} = Z_{31} = Z_{42} = -j(Z_{oe}\cot(\beta_e l) + Z_{oo}\cot(\beta_o l))/2$
$Z_{14} = Z_{23} = Z_{32} = Z_{41} = -j(Z_{oe}\cot(\beta_e l) - Z_{oo}\cot(\beta_o l))/2$ One of ordinary skill in the art will appreciate that this approach may also be used to model more than a pair of coupled lines. Accordingly, inductor device design/optimization system 610 may incorporate the corresponding systems of alternative equations to model more than a pair of coupled lines. One of ordinary skill in the art will further appreciate that inductor device design/optimization system 610 may be used to model and simulate frequency responses for asymmetric multi-line lossy-coupled line sections, as described in S. Dalmia, et al., "Modeling of Embedded RF Passives Using Coupled Lines and Scalable Models," IEEE Electronics, Components and Technology Conference (ECTC), May 2001.

Furthermore, inductor device design/optimization system 610 is not limited to homogenous substrates and may be used for multi-layered dielectric substrates. Significantly, inductor device design/optimization system 610 enables a designer to optimize the performance of RF passives by varying parameters, such as line width and spacing, for different coupled line sections in the passive design. An example of such an optimization would be in the case of spiral inductors where wider outer turns and narrower inner turns helps reduce ohmic losses in the outer turns and eddy current losses in the inner turns, respectively.

Moreover, inductor device design/optimization system 610 may be configured to include other variables, such as the surface roughness of the signal lines, the effect of varying dielectric constants, and non-uniform cross-section in the analysis of the coupled transmission lines. For instance, these variations are typical in laminate technology and/or organic technology, which use a sequential build up process. Tools such as ANSOFT HFSS®. may be used to model these non-uniformities, but such tools may be computationally expensive. Tools that utilize emperical equations, such as Agilent's ADS®, reduce computation time, but are limited in terms of bandwidth and need constant revision for new processes and new topologies. Tools such as SONNET, which is a method-of-moments tool, considered optimal for simulating planar components such as inductors, overestimate the loss in the device in components with thick conductors.

The voltage and current vectors, V and I, on a multi-conductor coupled line, which propagate energy in the ±z direction, can be written as $$-\frac{\partial^2}{\partial z^2} V = ZYV \quad (2)$$

$$-\frac{\partial^2}{\partial z^2} I = YZI \quad (3)$$

where $$Z=(R(f)+j\omega[L]) \quad (4)$$

$$Y=(G(f)+j\omega[C_e]) \quad (5)$$

In Equations (4) and (5), R(f) and G(t) represent the conductor loss and dielectric loss respectively. Both these parameters are frequency dependent. For RF and microwave applications, where the current penetration depth in the conductor is of the order of micrometers, the frequency dependence of the resistance matrix, R, conductance matrix, G, and inductance matrix, L, can be written in the form Equation (6)–(8) below:

$$R(f) = R_{DC} + R_{AC}\sqrt{f}, \quad (6), (7), (8)$$

$$L = L_e + L_i \frac{1}{\sqrt{f}} \text{ and } G(f) = G_1 \times f \ f_1$$

In the above equations, $L_e$ and $C_e$ represent the external inductance and capacitance matrices respectively; $\omega=2\pi f$ is the angular frequency. Equations (6)–(8) can be used to capture the frequency effects in the inductor. $R_{DC}$ and $R_{AC}$ are computed by solving for the total resistance matrix, R, at two different frequencies using commercial tools such as ANSOFT2D. Similarly, $L_i$ and $L_e$ are computed by solving for the inductance matrix, L, at two different frequencies. The conductance matrix, $G_1$, is computed at a particular frequency ($f_1$) and then computed at other frequencies (f) using Equations (6)–(8). $C_e$ is assumed to be constant with frequency. Equations (6)–(8) ignore the dependence of the dielectric constant on frequency, which is typical for dielectric substrates such as Vialux and PPE used in MCM-L processes.

The variations in dielectric constant can be introduced in the computation of the R, G and C matrices by observing the emperical equations for the lines under consideration. For example, in the quasi-TEM range, the effective dielectric constant, $\epsilon_{eff}$ of CPW lines is proportional to $(\epsilon_{ru1}(f_u)+\epsilon_{ru2}(f_u))/2$ where $\epsilon_{ru1}$ and $\epsilon_{eff}$ dielectric constants for Dielectric A and Dielectric B at a particular frequency $f_u$. Assuming one of the dielectrics to be air or vaccuum simplifies the Equation to:

$$C_u(f_u) \alpha \ \epsilon_{eff}(f_u) \alpha \ (\epsilon_{ru}(f_u)+1)/2 \quad (9)$$

After computing the capacitance matrix $C_u$ at a frequency $f_u$, with a dielectric constant of $\epsilon_{ru}$, using ANSOFT2D, the C matrices at other frequencies can be obtained by using the quasi-TEM relationship described in Equation (9). The capacitance matrix $C_1$ at frequency $f_1$, where the dielectric constant is $\epsilon_{r1}$ for CPW lines can be computed by using the following equation:

$$C_1(f_1)=C_u \times (\epsilon_{r1}+1)/(\epsilon_{ru}+1) \quad (10)$$

The L matrix is independent of the dielectric constant. The G matrix at different frequencies can be computed using G$\alpha$C.

For any transmission line, R($f_u$) is inversely proportional to Zo($f_u$) where Zo($f_u$) is the characteristic impedance of the line at frequency $f_u$. Since, Zo($f_u$) is also inversely proportional to $C_u$, the R matrix becomes directly proportional to $C_u$ as shown in Equation (11), below:

$$R(f_u) \alpha \frac{1}{Z_o} \alpha \sqrt{C_u} \quad (11)$$

The relationship between R and C, shown in Equation (11), along with Equation (10) can be used to capture the effect of varying dielectric constant on the R matrix.

The R matrix not only depends on the dielectric constant but also depends on skineffect and current-crowding effects. Current crowding is when the current distribution in lines, under the influence of an external time varying magnetic field, begins to concentrate along the edges of the lines. However, as expected current crowding is prominent only in very closely spaced turns of an inductor or closely spaced fingers of a capacitor. A reduction in current crowding and therefore skin effect becomes the dominant effect. As mentioned earlier skin effect has been taken into account in the modeling using the $\sqrt{f}$ dependence as shown in Equations (6)–(8).

Once the frequency dependant Z and Y matrices are obtained over the desired frequency range, for a wave propagating in the 'z' direction, the coupled Equations (2) and (3) can be partially de-coupled by solving the eigenvalue equation shown below:

$$(ZY-\lambda U).V=0 \tag{12}$$

and $$(YZ-\lambda U).I=0 \tag{13}$$

where, $-\lambda=\gamma^2$, U is the Identity Matrix and $\gamma=\alpha+j\beta$ is the complex propagation constant.

The n eigenvalues for n lines and n corresponding eigen modal voltage and current vectors can be obtained by solving Equations (5) and (6)–(8) respectively. These can be used to define the behavior of the n lines completely. Let $M_V$ and $M_I$ be the complex eigenvector matrix associated with the matrices ZY and YZ respectively. All normal voltages and currents on the line can be written as a linear combination of vectors, $\hat{V}$ and $\hat{I}$ as follows:

$$V=M_V\hat{V} \text{ and } I=M_I\hat{I} \tag{14}$$

Substitution of Equation (13) into (2) and (3) yields:

$$-\frac{\partial^2}{\partial z^2}\hat{V} = (M_V^{-1}ZYM_V)\hat{V} \tag{15}$$

$$-\frac{\partial^2}{\partial z^2}\hat{I} = (M_I^{-1}YZM_I)\hat{I}$$

$$(M_V^{-1}ZYM_V) = (M_I^{-1}YZM_I) = \gamma^2$$

Since this is an eigenvalue problem a normalization procedure is required. In this paper the following normalization is used:

$$(M_V^{-1})^t = M_I \tag{16}$$

The computation of eigenvectors in Equation (13) requires care, because of the properties of the ZY product. This product results in a diagonal dominant matrix, which has very closely spaced eigenvalues, which may give rise to difficulties and inaccuracies in the numerical computation. To avoid this difficulty an eigenvalue-shifting technique has been used. The shift is done by subtracting from ZY a scalar diagonal matrix with elements equal to the trace of ZY divided by n:

$$(ZY)' = ZY - \gamma_{av}^2 E, \gamma_{av}^2 = \frac{1}{n}\sum_{i=1}^{n}(ZY)_{ii} \tag{17}$$

The resulting matrix (ZY)' is then diagonalized, yielding a set of adequately spaced eigenvalues $\gamma'_1, \ldots, \gamma'_k, \ldots \gamma'_n$ and a corresponding set of eigenvectors. The eigenvectors of ZY are exactly equal to those of (ZY)'. The eigenvalues of the original product ZY can be obtained by shifting back the eigenvalues as follow:

$$\gamma'^2_k = \gamma_{av}^2 + \lambda_k \ (k=1, \ldots, n) \tag{18}$$

This analysis is based on the diagonalization of the matrix ZY, whose solution enables the computation of the propagation modes traveling along the structure.

By solving for the voltages, V(0) and V(l) and currents, I(0) and I(l) at the ends of the multiple coupled line section, the impedance matrix can be derived as:

$$\begin{bmatrix} V(0) \\ V(l) \end{bmatrix} = \begin{bmatrix} Z_{11} & Z_{12} \\ Z_{21} & Z_{22} \end{bmatrix} \begin{bmatrix} I(0) \\ I(l) \end{bmatrix} \tag{19}$$

$$Z_{11} = Z_{22} = COTH(\Gamma l)Z_w;$$

$$Z_{12} = Z_{21} = CSCH(\Gamma l)Z_w$$

where, $$COTH(\Gamma l) = M_V(coth\gamma l)M_V^{-1}$$

$$CSCH(\Gamma l) = M_V(csch\gamma l)M_V^{-1}$$

$$Z_w = M_V\gamma M_V^{-1}Y^{-1}$$

The above representation enables the designer to optimize the performance of RF passives by varying parameters such as line width, length and spacing for different coupled line sections using a 2D electromagnetic solver.

Accordingly, inductor device design/optimization system 610 may be configured to incorporate the variations mentioned above for different topologies, such as CPW, microstrip, etc. Once the matrices for the coupled lines and for the scalable functions are obtained they can be cascaded using the segmentation approach described above.

The underlying basis of the segmentation approach is the transformation of the field matching (electric and magnetic fields) along the interface between two regions with higher mode excitations into an equivalent network connection problem using S-, Z-, or Y-matrices. Because Z-matrix characterizations of multiple-coupled lines and planar discontinuities can be obtained as solutions of ordinary differential equations, it becomes computationally efficient to develop a segmentation procedure in terms of Z-parameters.

Referring again to FIG. 14, after simulating the frequency response of the coupled-line models, at block 710, inductor device design/optimization system 610 determines one or more optimal configurations for the inductor to be designed, which satisfies the design parameters and process parameters. Inductor device design/optimization system 610 may be further configured to provide the optimal configurations to the user via an input/output device 614 and a network interface device 612. Inductor device design/optimization system 610 terminates at block 712.

Another very important element that this optimization enables is the addition of the shield effect as well as the capability to model hybrid devices such as CPW/stripline. This attribute of the optimization is imperative to understand whether or not the shield, thought of as a short between, for example, upper and bottom ground planes of a stripline configuration degrades the performance of the device.

IV. Coupling Between Inductors

Figure 18:
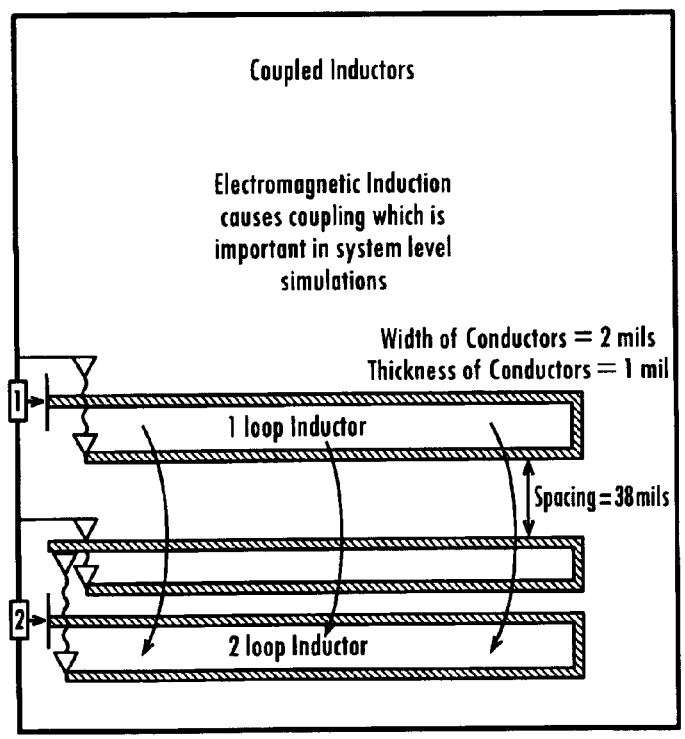
FIG. 18 is a schematic illustration of the coupling of two one-port loop inductors.
Figure 19:
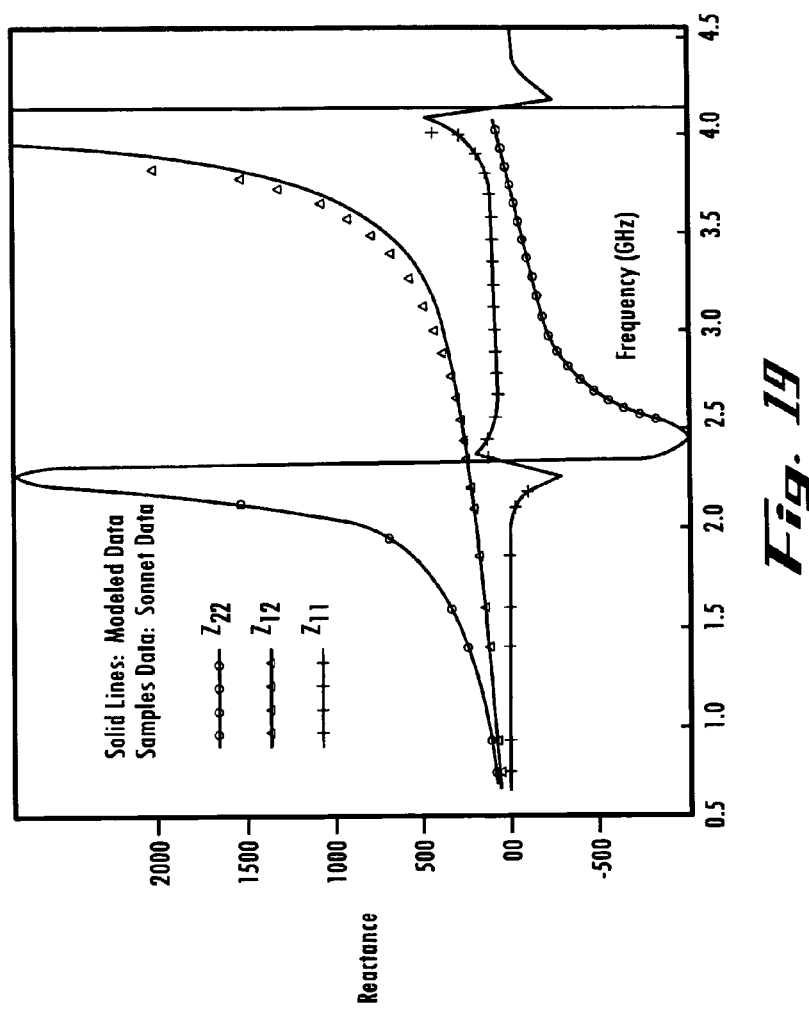
FIG. 19 is a graphical illustration of the modeling responses obtained for the two 1-port loop inductors of FIG. 18 as a two-port response.

The modeling technique discussed above for individual inductors is now applied to modeling the coupling between multiple inductors. FIG. 18 shows two 1-port inductors (with ports 1 and 2 as the input ports of the two inductors) modeled in SONNET on the same multi-layered lossy substrate. The structure was modeled using the technique mentioned above; however, the result was obtained as a 2 port response instead of a 1-port inductor response. The 2 port response captured the coupling of two 1-port inductors. The comparison of the responses obtained from SONNET and the modeling technique is shown in FIG. 19.

The results show good correlation and capture the coupling effect ($Z_{12}=Z_{21}$) between the two inductors. It is important to note that the coupling is a function of the distance between the inductors and also the cross-sectional configuration of the two inductors. Optimization of the coupling and isolation parameters based on a full-wave tool such as SONNET can get very tedious. For example, SONNET took approximately 26 minutes to simulate the response for twenty four frequency points on an Ultra 30 Sparc Station, whereas the modeling technique of the present invention, including the time to obtain the R, L, G, C parameters from ANSOFT 2D on a 600 MHz Celeron Processor, took approximately 12 minutes. Tools such as the Advanced Design Suite (ADS) by Agilent can model the coupling of ideal inductors or model lossy inductors as a function of frequency with the aid of design equations but cannot model the coupling of lossy inductors. The technique discussed herein is a hybrid technique, which is circuit based and is more adaptable for the optimization of embedded RF circuits. This is primarily due to the use of 2D analysis for electrically large structures, use of 3D analysis for electrically short structures and the ability to combine these results through the segmentation method.

The coupling of inductors becomes an important design parameter in the design of devices with multiple inductors such as baluns, filters, etc. The coupling if not modeled leads to parasitic behavior whereas if properly predicted can help achieve additional functionality in the circuits.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An organic stand-alone inductor device, comprising:
   a device component comprising a first organic substrate on which at least one inductor is formed;
   a first core layer of organic material adjacent the device component; and
   side shielding on at least two sides of the inductor that is electrically connected to a ground voltage, wherein the side shielding comprises an inbuilt layer of conductive material fabricated on a same plane as the inductor.

2. The stand-alone inductor of claim 1, further comprising a second core layer disposed adjacent the device component, opposite the first core layer.

3. The stand-alone inductor of claim 1, wherein the device component layer comprises a plurality of organic substrates bonded together, wherein each organic substrate includes at least one inductor.

4. The stand-alone inductor of claim 3, wherein at least two of the plurality of organic substrates are electrically interconnected by a via.

5. The stand-alone inductor of claim 1, wherein the inductor device includes at least two terminal, and the inductor is electrically connected to one of the terminals.

6. The stand-alone inductor of claim 1, wherein the side shielding further comprises at least one external layer of conductive material electrically connected to the inbuilt layer of conductive material.

7. The stand-alone inductor of claim 1, wherein the device component comprises two bond ply layers that sandwich the first organic substrate.

8. The stand-alone inductor of claim 1, further comprising a second device component comprising a second organic substrate on which at least a second inductor is formed, the second device component is disposed adjacent the core layer, opposite the device layer.

9. The stand-alone inductor of claim 8, wherein the device component and second device component are electrically connected by a via in the core layer.

* * * * *